United States Patent
Hirairi (12)

(10) Patent No.: US 6,414,529 B1
(45) Date of Patent: Jul. 2, 2002

(54) LATCH AND D-TYPE FLIP-FLOP

(75) Inventor: Koji Hirairi, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/960,522

(22) Filed: Sep. 24, 2001

(30) Foreign Application Priority Data

Sep. 27, 2000 (JP) ..................................... 2000-293869

(51) Int. Cl.$^7$ ............................................. H03K 3/037
(52) U.S. Cl. ..................................... 327/218; 327/202
(58) Field of Search .............................. 327/199–204, 327/208, 210–212, 214, 215, 218, 219, 222

(56) References Cited

U.S. PATENT DOCUMENTS

| | | | | |
|---|---|---|---|---|
| 5,023,475 A | * | 6/1991 | Ducourant | 327/203 |
| 5,986,490 A | * | 11/1999 | Hwang et al. | 327/202 |
| 6,081,153 A | * | 6/2000 | Hamada et al. | 327/202 |
| 6,147,514 A | * | 11/2000 | Shiratake | 327/55 |
| 6,191,629 B1 | * | 2/2001 | Bisanti et al. | 327/202 |

FOREIGN PATENT DOCUMENTS

| | | |
|---|---|---|
| EP | 0 793 342 A2 | 9/1997 |
| JP | 4-274612 | 9/1992 |
| JP | 11-41071 | 2/1999 |

OTHER PUBLICATIONS

J. Montanaro et al, "A 160 MHz 32b 0.5W CMOS RISC Microprocessor", ISSCC Digest of Technical Papers, pp. 214–215, Feb. 1996.

* cited by examiner

Primary Examiner—My-Trang Nuton
(74) Attorney, Agent, or Firm—Ronald P. Kananen, Esq.; Rader, Fishman & Grauer, PLLC

(57) ABSTRACT

A latch and a D-type flip-flop capable of realizing high speed operation and capable of achieving a reduction of power consumption, wherein in a master side latch, a first NMOS transistor always in the ON state is provided as a first parallel resistor means connected in parallel with a second NMOS transistor (serving as the first input discriminating means) receiving a data input signal D, and a third NMOS transistor always in the ON state is provided as a second parallel resistor means connected in parallel with a fourth NMOS transistor NT114 (serving as the first input discriminating means) receiving an inverted data input signal DX. By this, without enlarging the transistor sizes of the second and fourth NMOS transistors, an equivalent combined resistance of discharge paths can be reduced by these parallel resistor means, a high speed operation can be realized, and a lowering of a power consumption can be realized.

8 Claims, 19 Drawing Sheets

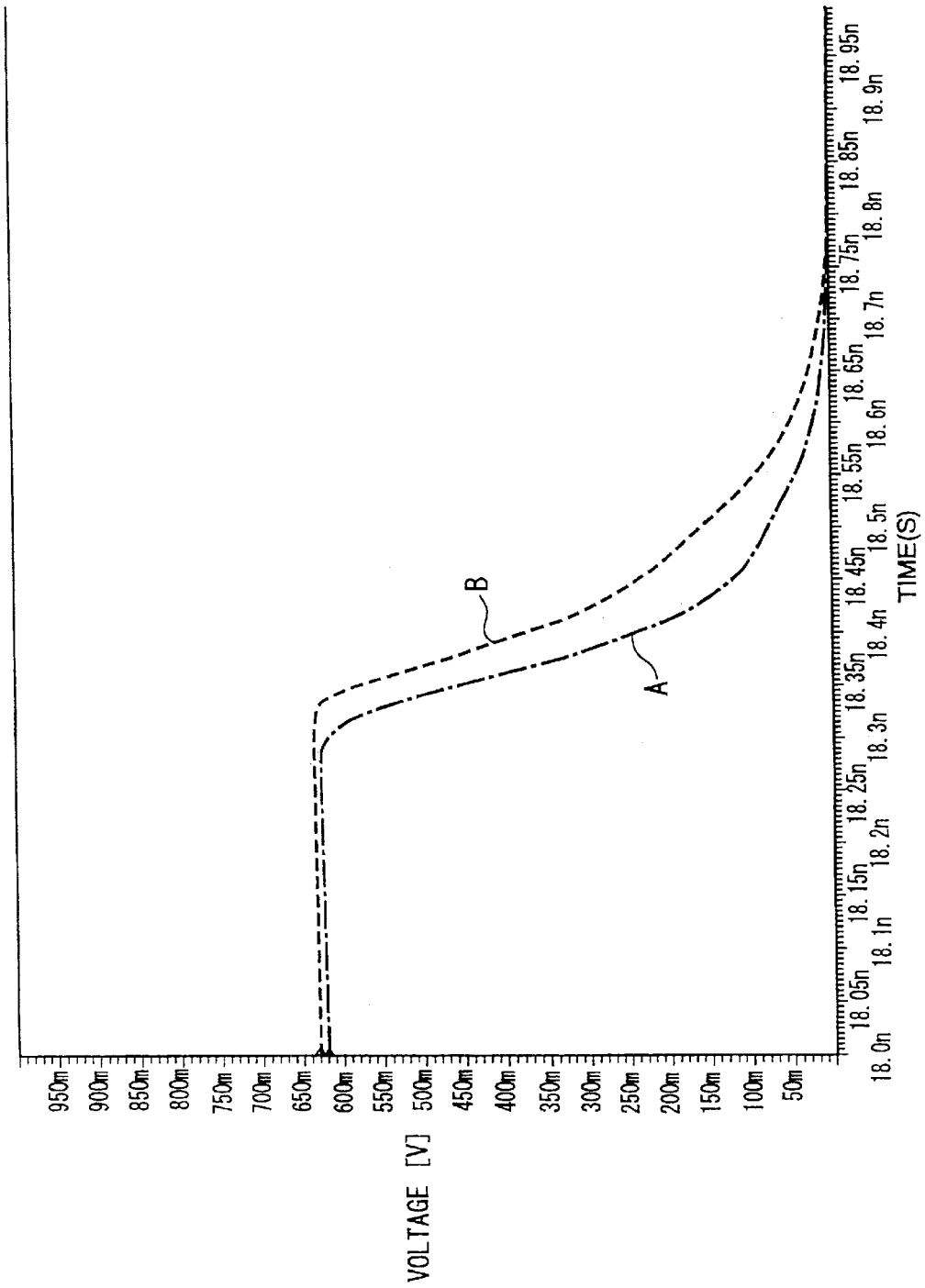

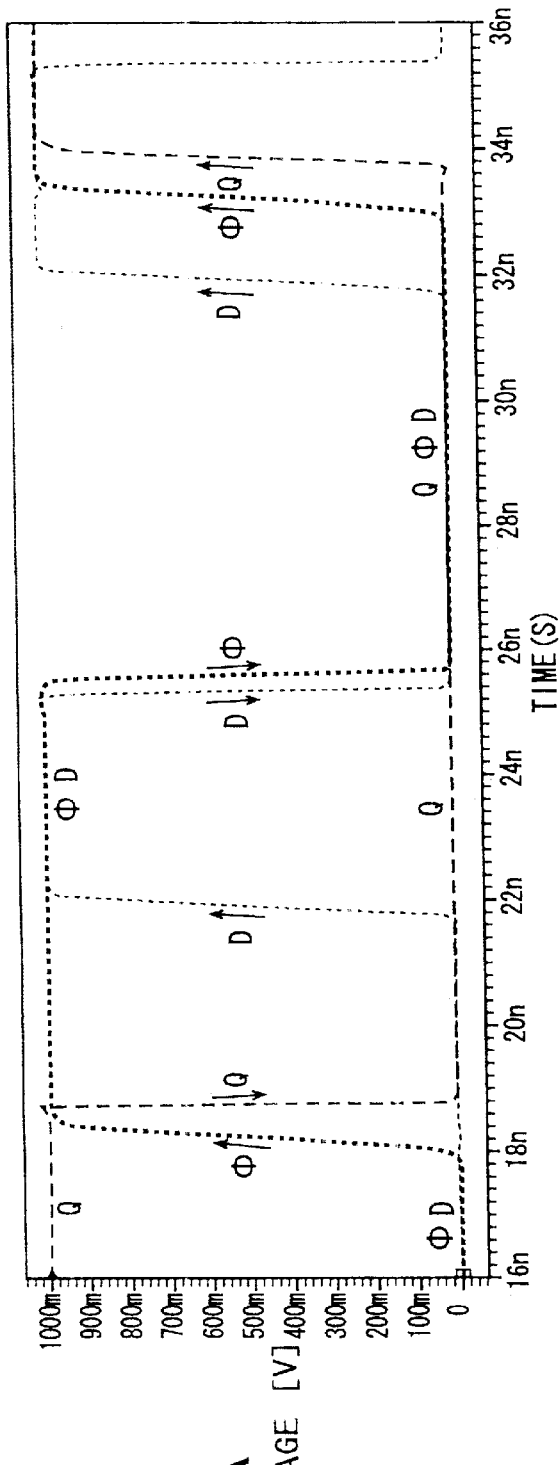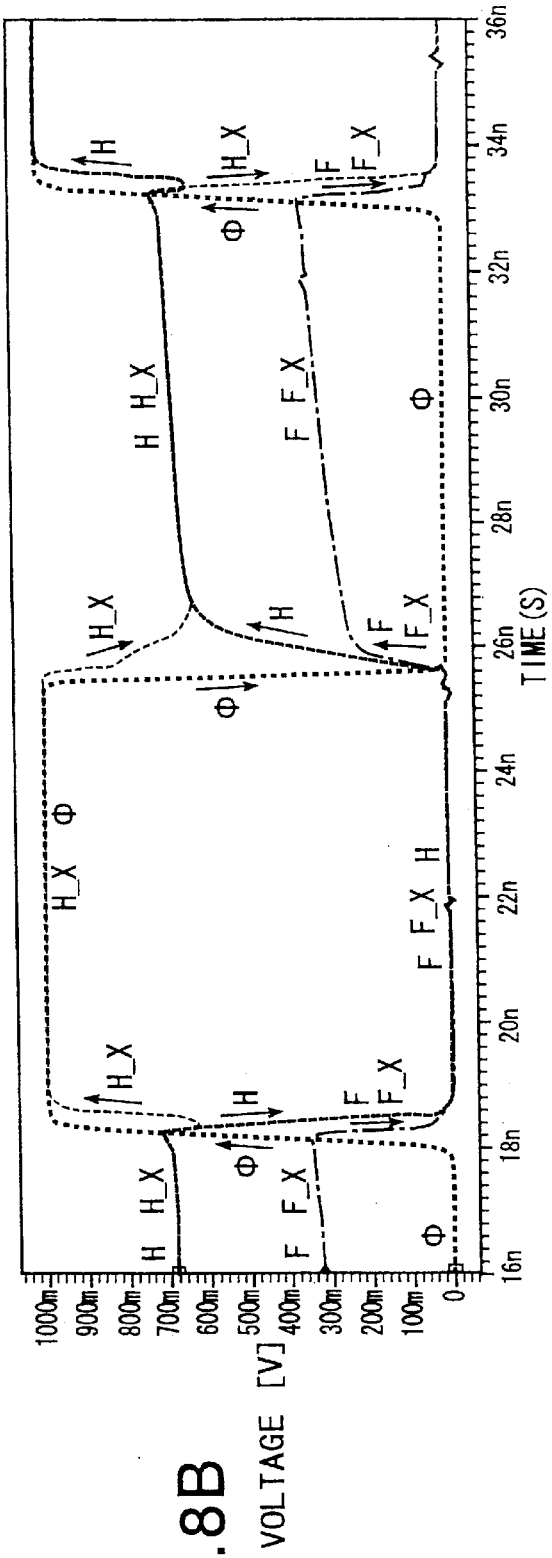
FIG.8A
FIG.8B

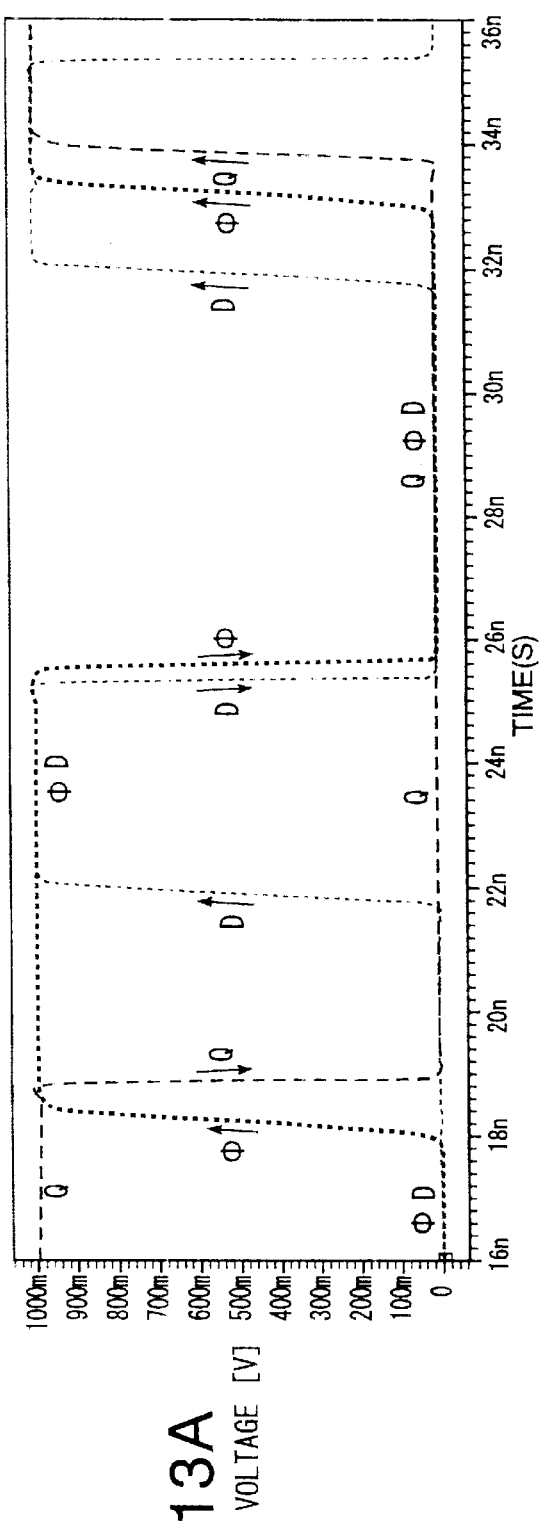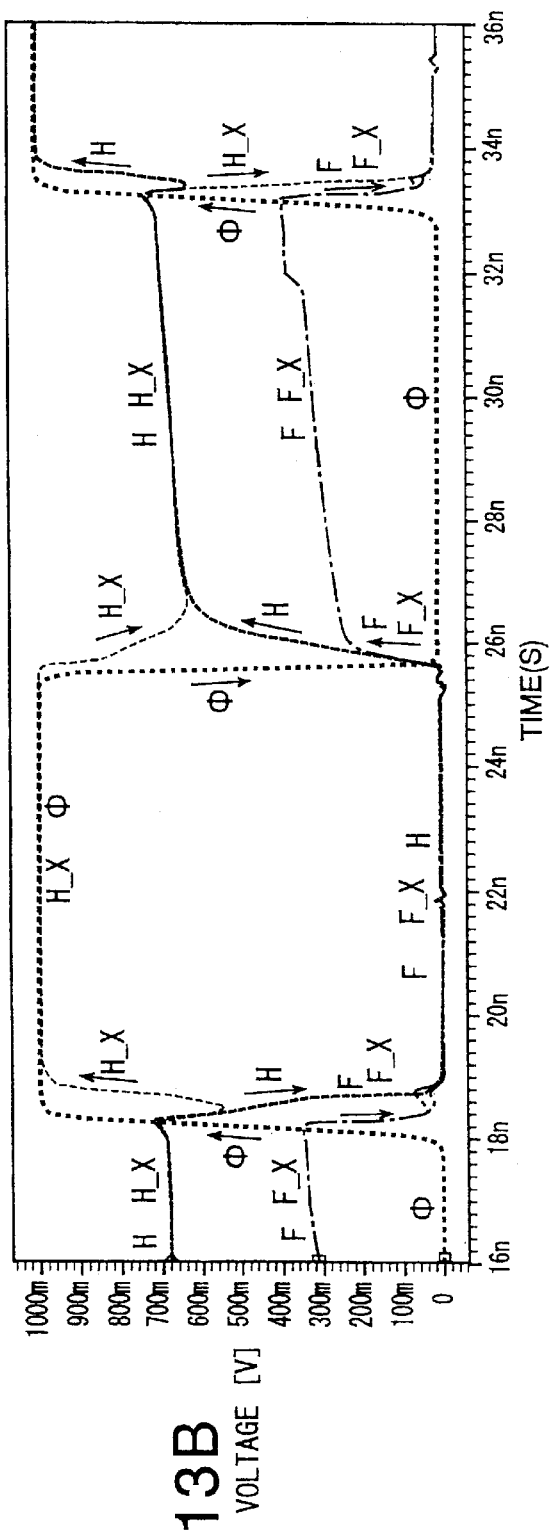

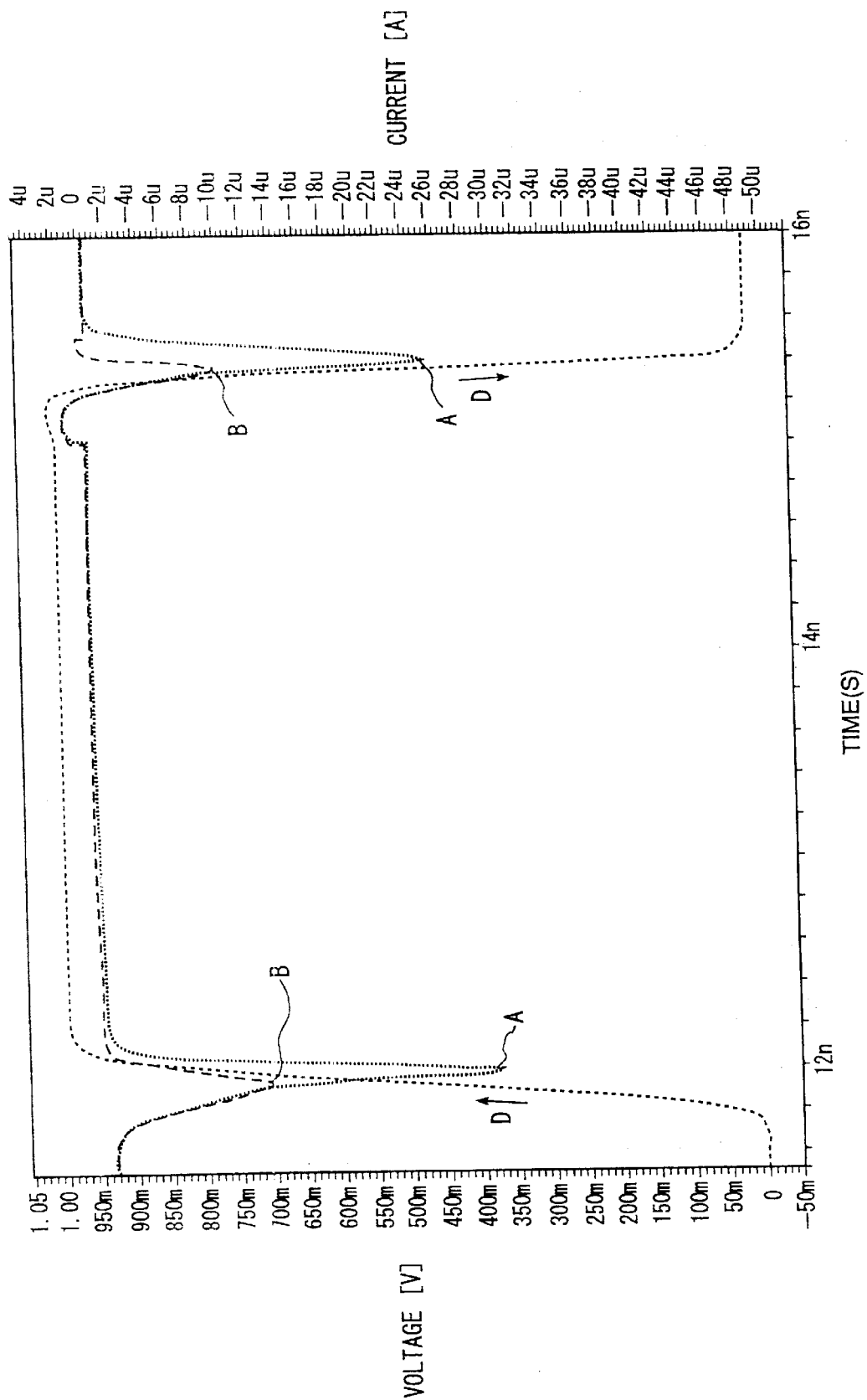

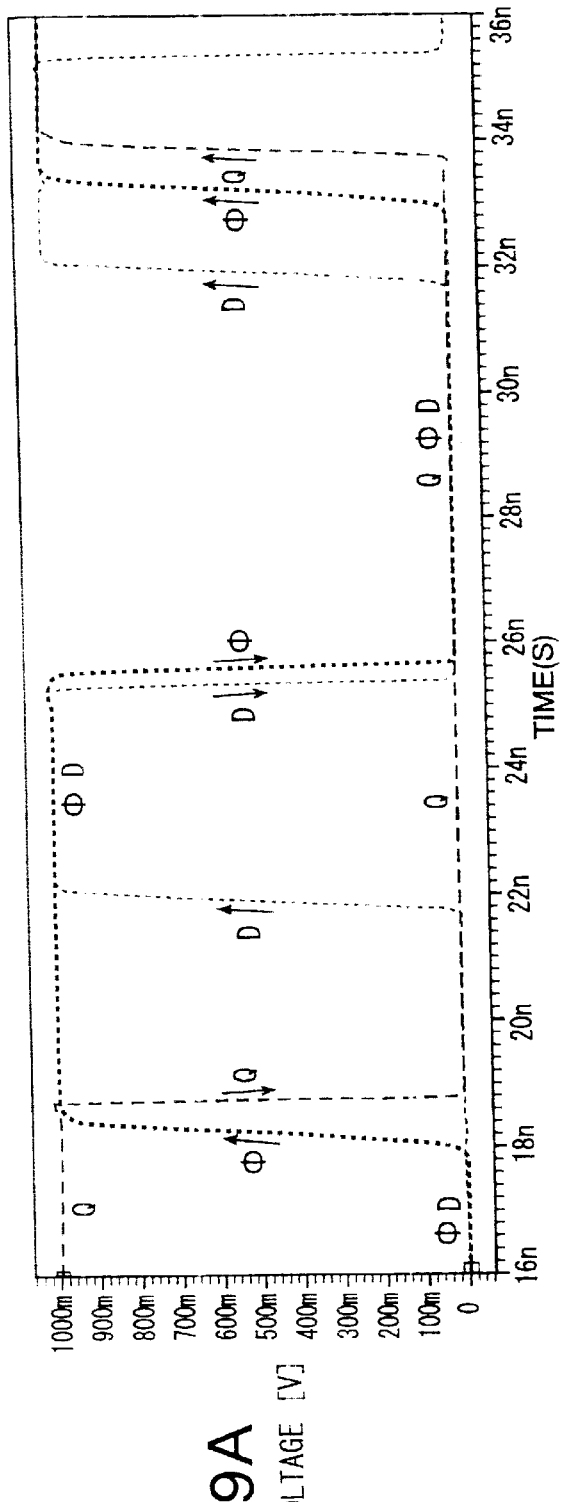
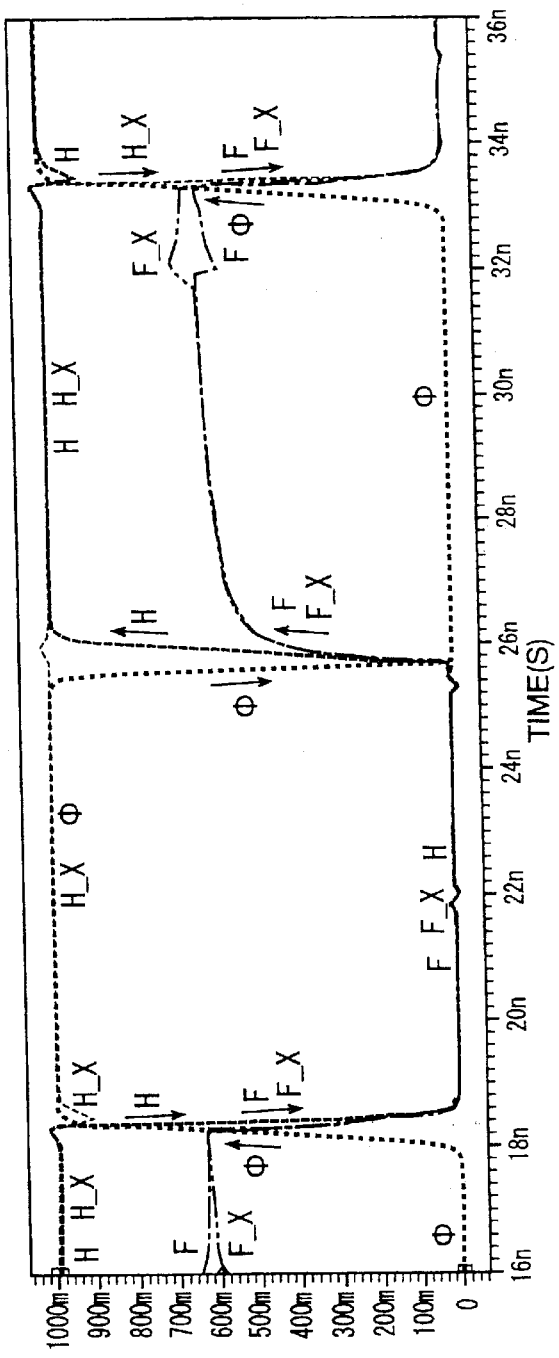
FIG. 19A
FIG. 19B

LATCH AND D-TYPE FLIP-FLOP

BACKGROUND OF THE INVENTION

1. Field of the Invention

The present invention relates to a latch using a differential sense amplifier in a CMOS integrated circuit and a D-type flip-flop. More concretely, it relates to a latch mounting a differential sense amplifier using an inverter loop and a D-type flip-flop comprised using this as a master side latch and using an RS latch as a slave side latch.

2. Description of the Related Art

As one important element determining an operation frequency and/or power consumption of a CMOS VLSI, a D-type flip-flop can be mentioned.

Various procedures for raising the speed of a flip-flop and lowering the power consumption have continued to be proposed up to the present.

The D-type flip-flops announced in recent years include a D-type flip-flop referred to as a "sense amplifier-based flip-flop" (document: J. Montanaro et al., "A 160 MHz 32b 0.5 W COMS RISC Microprocessor", *ISSCC Digest of Technical Papers*, pp. 214–215, February 1996).

Below, this D-type flip-flop will be referred to as a "differential sense amplifier type D-type flip-flop".

This differential sense amplifier type D-type flip-flop is one type of master/slave flip-flop comprised of a combination of a master latch and a slave latch.

The conventional master/slave flip-flop is a combination of D-type latches.

Contrary to this, a differential sense amplifier type D-type flip-flop mounts a differential sense amplifier using an inverter loop for the master side latch, mounts an RS latch for the slave side latch, and combines them to realize a D-type flip-flop.

FIG. 16 is a circuit diagram of an example of the configuration of a conventional differential sense amplifier type D-type flip-flop.

This differential sense amplifier type D-type flip-flop 1 is comprised by a master side latch 2 and a slave side latch 3 connected in cascade via nodes H and H_X as shown in FIG. 16.

The master side latch 2 has p-channel MOS (PMOS) transistors PT21 to PT24, n-channel MOS (NMOS) transistors NT21 to NT26, an inverter INV21, a synchronization signal input terminal TΦ, a data input terminal TD, and data output terminals TQ and T_QX.

Sources of the PMOS transistors PT21 to PT24 are connected to a supply line of a power supply voltage $V_{DD}$.

Drains of the PMOS transistors PT21 and PT22 are connected to the drain of the NMOS transistor NT21, and a connection node ND21 thereof is connected to a gate of the PMOS transistor PT23, a gate of the NMOS transistor NT22, and the node H_X.

The drains of the PMOS transistors PT23 and PT24 are connected to the drain of the NMOS transistor NT22, and a connection node ND22 thereof is connected to a gate of the PMOS transistor PT22, a gate of the NMOS transistor NT21, and the node H.

Then, gates of the PMOS transistors PT21 and PT24 are connected to the synchronization signal input terminal TΦ.

The source of the NMOS transistor NT21 is connected to the drain of the NMOS transistor NT23, and an intermediate node F_X is comprised by the connection point thereof. The source of the NMOS transistor NT22 is connected to the drain of the NMOS transistor NT24, and an intermediate node F is comprised by the connection point thereof.

Sources of the NMOS transistor NT23 and NMOS transistor NT24 are connected to each other, and an intermediate node G is comprised by the connection point thereof. This intermediate node G is connected to the drain of the NMOS transistor NT25, and the source of the NMOS transistor NT25 is connected to a ground potential GND.

Then, the source and the drain of the NMOS transistor NT26 are connected to the nodes F and F_X.

A gate of the NMOS transistor NT23 is connected to the data input terminal TD, a gate of the NMOS transistor NT24 is connected to an output terminal of the inverter INV21, and an input terminal of the inverter INV21 is connected to the data input terminal TD. A gate of the NMOS transistor NT25 is connected to the synchronization signal input terminal TΦ, and a gate of the NMOS transistor NT26 is connected to the supply line of the power supply voltage $V_{DD}$.

Also, the slave side latch 3 is comprised by 2-input NAND gates NA31 and NA32.

A first input terminal of the NAND gate NA31 is connected to the node H, and a second input terminal is connected to an output terminal of the NAND gate NA32 and the output terminal TQ of the output data Q.

A first input terminal of the NAND gate NA32 is connected to the node H_X, and a second input terminal is connected to an output terminal of the NAND gate NA31 and the output terminal TQ_X of the inverted output data Q_X.

Next, a detailed explanation will be made of the operation of the conventional differential sense amplifier type D-type flip-flop 1.

This flip-flop 1 fetches the value of the data input signal D in synchronization with a rising edge of the synchronization signal Φ and outputs the same to the data output terminal TQ and the inverted data output terminal TQ_X. The value is held for one cycle of the synchronization signal Φ.

In the period where Φ=0, the PMOS transistors PT21 and PT24 become ON, and the NMOS transistor NT25 becomes cut off.

FIG. 17 is a view of an equivalent circuit of the circuit of FIG. 16 in this period where Φ=0 and where the data input signal D=1.

In the period where Φ=0, the PMOS transistors PT21 and PT24 equivalently behave as resistors, and the nodes H and H_X are precharged to the potential of complete logic 1 through them.

Then, the PMOS transistors PT22 and PT23 become cut off. The NMOS transistors NT21 and NT22 equivalently behave as diodes since the gate terminals and the drain terminals become the same potentials.

Accordingly, when the power supply voltage is $V_{DD}$ [V] and the threshold value of the NMOS transistor is Vtn, the potentials of the nodes F and F_X at this time an be estimated to be $(V_{DD}-Vtn)$ [V].

When Φ=0, both of the output nodes H and H_X of the master side latch 2 have the logic 1. This operates NAND-RS latch of the slave side latch 3 as the hold mode.

When Φ becomes equal to 1, the PMOS transistors PT21 and PT24 become cut off, the NMOS transistor NT25 becomes ON, and the sense amplifier operates.

Either of the NMOS transistor NT23 and the NMOS transistor NT24 has become cut off according to state of the data input signal D and the inverted signal DX thereof. In the example of FIG. 17, the NMOS transistor NT24 has become cut off.

At this time, a difference is produced in conductive resistances possessed by the nodes F and F_X with respect to the ground.

A view simply considering the conductive resistances of the nodes F and F_X is shown in FIG. 18.

According to this FIG. 18, the conductive resistance possessed by the node F_X with respect to the ground becomes (r23+r25) Ω, and the conductive resistance of the node F becomes (r26+r23+r25) Ω.

Such a difference of conductive resistances appears in the discharge speed of charges on the nodes H and H_X. In this example, the conductive resistance possessed by the node F_X with respect to the ground is smaller, so the charge on the node H_X is more quickly discharged. At this time, also the charge on the node H is discharged.

However, due to the lowering of the potential of the node H_X, the PMOS transistor PT23 becomes ON and the NMOS transistor NT22 becomes cut off, and the potential of the node H which starts lower rises to obtain the potential of a complete logic 1 again.

In this way, a normal state is established in the inverter loop comprised by the PMOS transistors PT22 and PT23 and the NMOS transistors NT21 and NT22.

Thereafter, even when the data input signal D and the inverted signal DX thereof change and the transistor which becomes cut off changes from the NMOS transistor NT24 to the NMOS transistor NT23, this normal state is not destroyed.

This is because, either of the NMOS transistors NT23 and NT24 is always ON, and both of the nodes F and F_X always have paths reaching the ground via the NMOS transistor NT26, so the inverter loop is always connected to the ground.

In this way, either of the output nodes H and H_X of the master side latch 2 becomes the logic 0 when Φ=1.

Upon receipt of this, the RS latch of the slave side R latch 3 is set or reset, and the value in accordance with the input data appears at the outputs Q and QX.

FIGS. 19A and 19B are views of operation waveforms obtained by circuit simulations of the flip-flop 1 of FIG. 16.

The flip-flop 1 of FIG. 16 is characterized in a small clock load because of a high speed sampling operation by the differential sense amplifier and the small number of transistors connected to the input terminal TΦ of the synchronization signal Φ, i.e., 3 in comparison with the conventional master/slave flip-flop combining the D-latches.

However, the conventional differential sense amplifier type D-type flip-flop shown in FIG. 16 has the following problems 1, 2, and 3.

Problem 1: Problem of Speed

The operation speed of the differential sense amplifier type D-type flip-flop 1 is determined as the discharge speed of charges on the nodes H and H_X. Then, this discharge speed is determined as the conductive resistances possessed by the nodes F and F_X with respect to the ground.

Namely, for a high speed operation of this flip-flop 1, the conductive resistances of the nodes F and F_X must be small.

The resistance values r26, r23, and r25 in the equivalent circuit shown in FIG. 18 show equivalent resistance values when the NMOS transistors NT26, NT24, and NT25 become ON.

The equivalent resistance value R when the MOS transistor becomes ON is proportional to a gate length L of the transistor and inversely proportional to the gate width W.

In the general design of a CMOS VLSI logic circuit, the gate length L is fixed to the minimum value. Accordingly, the quantity which can be operated on in the design is the gate width W. In order to reduce the conductive resistances, it is necessary to enlarge the gate width W of each transistor.

However, the gate capacity C of the MOS transistor becomes large in proportion to the product of L and W. For this reason, there arises a problem in that, when the gate width W is enlarged, the gate capacity increases and the power consumption increases.

Problem 2: Problem 1 in Power

In the differential sense amplifier type D-type flip-flop 1, the number of the transistors connected to the input terminal TΦ of the synchronization signal Φ is 3 and small, and the clock load is small.

However, this does not always means that the power consumed for the clock can be reduced.

At the change from Φ=1 to Φ=0, charges are supplied to the node outputting the logic 0 between the nodes H and H_X. The nodes H and H_X are also connected to the RS latch of the slave side latch 3, so the charges are also supplied to the gate capacity possessed by the RS latch.

Also, at the change from Φ=1 to Φ=0, the potentials of both of the nodes F and F_X rise from 0 [V] to $(V_{DD}-Vtn)$ [V]. Also at this time, considerable charges are supplied from the power supply.

That is, although the number of the transistors connected to the input terminal TΦ of the synchronization signal Φ is three, the charges from the power supply are also supplied to other locations than the gate capacities possessed by these three transistors.

Accordingly, actually, the amount of charges charged or discharged in accordance with the change of the clock signal (synchronization signal) input to the input terminal TΦ is large, and the power consumption does not become small.

Problem 3: Problem 2 in Power

The differential sense amplifier type D-type flip-flop 1 needs the data input signal D and the inverted signal DX thereof in its operation principle.

In the design of a general CMOS VLSI logic circuit, one bit of a data signal is transmitted by one signal line. The method of always preparing the inverted signal of the data and transmitting one bit of a data signal by two lines is technically possible, and has been already put into practical use, but its use is limited to special regions.

Accordingly, in the general case, it is necessary to use the inverter INV21 as shown in FIG. 16 and prepare the inverted signal of the data input by itself.

The maximum determining factor of the power consumption in the CMOS VLSI logic circuit is the charge and discharge of charges accompanied with a change of the node potential. That is, when the input signal changes, power is consumed.

In the case of the circuit of FIG. 16, when the data input signal D changes, power is consumed in the NMOS transistors NT23 and NT24 and the inverter INV21.

As mentioned before, a differential sense amplifier type D-type flip-flop 1 has to use an inverter for generating an inverted signal of a data input signal in its operation principle, so there is the problem that this inverter's worth of the power consumption cannot in principle be reduced when considering reduction of the power consumption.

SUMMARY OF THE INVENTION

An object of the present invention is to provide a latch and a D-type flip-flop capable of realizing high speed operation.

Also, a second object of the present invention is to provide a latch and a D-type flip-flop capable of achieving a reduction of the power consumption.

According to a first aspect of the present invention, there is provided a latch comprising: a first output node; a second output node; a first intermediate node; a second intermediate node; a third intermediate node; an inverter loop having a first inverter provided with first and second power supply terminals and having the first power supply terminal connected to the first intermediate node and a second inverter provided with first and second power supply terminals and having the first power supply terminal connected to the second intermediate node, the output terminal of the first inverter and the input terminal of the second inverter being connected to the first output node, and the output terminal of the second inverter and the input terminal of the first inverter being connected to the second output node; a first input discriminating means containing a resistor component, electrically isolating the first intermediate node and the third intermediate node when the data input signal is at a first potential level, and connecting them when it is at a second potential level; a second input discriminating means containing a resistor component, electrically isolating the second intermediate node and the third intermediate node when an inverted signal of the data input signal is at the first potential level, and connecting them when it is at the second potential level; a first parallel resistor means connected between the first intermediate node and the third intermediate node in parallel with the first input discriminating means; a second parallel resistor means connected between the second intermediate node and the third intermediate node in parallel with the second input discriminating means; a power supply isolating means for electrically isolating the third intermediate node and a reference potential when a synchronization signal is at the first potential level and connecting them when it is at the second potential level; and a presetting means for setting the first output node and the second output node at predetermined potentials when the synchronization signal is at the first potential level.

According to a second aspect of the present invention, there is provided a latch comprising: a first output node; a second output node; a first intermediate node; a second intermediate node; a third intermediate node; an inverter loop having a first inverter provided with first and second power supply terminals and having the first power supply terminal connected to the first intermediate node and a second inverter provided with first and second power supply terminals and having the first power supply terminal connected to the second intermediate node, the output terminal of the first inverter and the input terminal of the second inverter being connected to the first output node, and the output terminal of the second inverter and the input terminal of the first inverter being connected to the second output node; a first discriminating means containing a resistor component, electrically isolating the first intermediate node and the third intermediate node when the data input signal is at the first potential level, and connecting them when it is at the second potential level; a second discriminating means containing a resistor component, electrically isolating the second intermediate node and the third intermediate node when the potential of the first output node is at the first potential level, and connecting them when it is at the second potential level; a first parallel resistor means connected between the first intermediate node and the third intermediate node in parallel with the first discriminating means; a second parallel resistor means connected between the second intermediate node and the third intermediate node in parallel with the second discriminating means; a power supply isolating means for electrically isolating the third intermediate node and the reference potential when the synchronization signal is at the first potential level and connecting them when it is at the second potential level; and a presetting means for setting the first output node and the second output node at predetermined potentials when the synchronization signal is at the first potential level.

According to a third aspect of the present invention, there is provided a D-type flip-flop comprising: a master side latch including a first output node; a second output node; a first intermediate node; a second intermediate node; a third intermediate node; an inverter loop having a first inverter provided with first and second power supply terminals and having the first power supply terminal connected to the first intermediate node and a second inverter provided with first and second power supply terminals and having the first power supply terminal connected to the second intermediate node, the output terminal of the first inverter and the input terminal of the second inverter being connected to the first output node, and the output terminal of the second inverter and the input terminal of the first inverter being connected to the second output node; a first input discriminating means containing a resistor component, electrically isolating the first intermediate node and the third intermediate node when the data input signal is at a first potential level, and connecting them when it is at a second potential level; a second input discriminating means containing a resistor component, electrically isolating the second intermediate node and the third intermediate node when an inverted signal of the data input signal is at the first potential level, and connecting them when it is at the second potential level; a first parallel resistor means connected between the first intermediate node and the third intermediate node in parallel with the first input discriminating means; a second parallel resistor means connected between the second intermediate node and the third intermediate node in parallel with the second input discriminating means; a power supply isolating means for electrically isolating the third intermediate node and a reference potential when a synchronization signal is at the first potential level and connecting them when it is at the second potential level; and a presetting means for setting the first output node and the second output node at predetermined potentials when the synchronization signal is at the first potential level and a slave side latch having a set terminal and a reset terminal connected to either of the first output node or the second output node of the master side latch and holding the logic output of the master side latch for one cycle of the synchronization signal.

According to a fourth aspect of the present invention, there is provided a D-type flip-flop comprising: a master side latch including a first output node; a second output node; a first intermediate node; a second intermediate node; a third intermediate node; an inverter loop having a first inverter provided with first and second power supply terminals and having the first power supply terminal connected to the first intermediate node and a second inverter provided with first and second power supply terminals and having the first power supply terminal connected to the second intermediate node, the output terminal of the first inverter and the input terminal of the second inverter being connected to the first output node, and the output terminal of the second inverter and the input terminal of the first inverter being connected to the second output node; a first discriminating means containing a resistor component, electrically isolating the first intermediate node and the third intermediate node when the data input signal is at the first potential level, and connecting them when it is at the second potential level; a second discriminating means containing a resistor component, electrically isolating the second intermediate node and the third intermediate node when the potential of the first output node is at the first potential level, and connecting them when it is at the second potential level; a first parallel resistor means connected between the first intermediate node and the third intermediate node in parallel with the first discriminating means; a second parallel resistor means connected between the second intermediate node and the third intermediate node in parallel with the second discriminating means; a power supply isolating means for electrically isolating the third intermediate node and the reference potential when the synchronization signal is at the first potential level and connecting them when it is at the second potential level; and a presetting means for setting the first output node and the second output node at predetermined potentials when the synchronization signal is at the first potential level and a slave side latch having a set terminal and the reset terminal connected to either of the first output node or the second output node of the master side latch and holding the logic output of the master side latch for one cycle of the synchronization signal.

Further, in the present invention, the presetting means includes a balancing means for electrically connecting the first output node and the second output node when the synchronization signal is at the first potential level and isolating them when it at the second potential level.

According to the present invention, the first parallel resistor means is connected between the first intermediate node and the third intermediate node in parallel with the first input discriminating means receiving the data input signal, and the second parallel resistor means is connected between the second intermediate node and the third intermediate node in parallel with the second input discriminating means receiving the inverted signal of the data input signal.

By this, the equivalent combined resistance of the discharge paths becomes small due to the first and second parallel resistor means.

As a result, high speed operation becomes possible.

Also, according to the present invention, initialization potentials of internal first and second intermediate nodes are lowered by the balancing means.

As a result, the power consumption is reduced.

Also, according to the present invention, the first parallel resistor means is connected between the first intermediate node and the third intermediate node in parallel with the first discriminating means receiving the data input signal, and the second parallel resistor means is connected between the second intermediate node and the third intermediate node in parallel with the second input discriminating means receiving the potential of the first output node.

Also, according to the present invention, initialization potentials of internal first and second intermediate nodes are lowered by the balancing means.

As a result, the power consumption is reduced.

BRIEF DESCRIPTION OF THE DRAWINGS

These and other objects and features of the present invention will become clearer from the following description of the preferred embodiments given with reference to the accompanying drawings, in which:

FIG. 5 is a view showing a potential waveform of a node F_X where the data input signal D=1 is given and a synchronization signal $\Phi$ is changed from 0 to 1 in the circuit of FIG. 1 according to the first embodiment and a conventional circuit of FIG. 16;

FIGS. 8A and 8B are views showing the operation waveform obtained by circuit simulation of the flip-flop of FIG. 6;

FIGS. 13A and 13B are views showing the operation waveform obtained by the circuit simulation of a flip-flop 10B of FIG. 10;

FIG. 14 is a view showing the waveform of the current flowing through the constant voltage source in a case where the data input signal D is changed from 0 to 1 and changed to 0 again, but the synchronization signal $\Phi$ is constant and not changed in the circuit of FIG. 6 according to the second embodiment and the circuit of FIG. 10 according to the present third embodiment;

FIGS. 19A and 19B are views showing the operation waveform by the circuit simulation of the flip-flop of FIG. 16.

DESCRIPTION OF THE PREFERRED EMBODIMENTS

Below, preferred embodiments will be described with reference to the accompanying drawings.

First Embodiment

Figure 1:
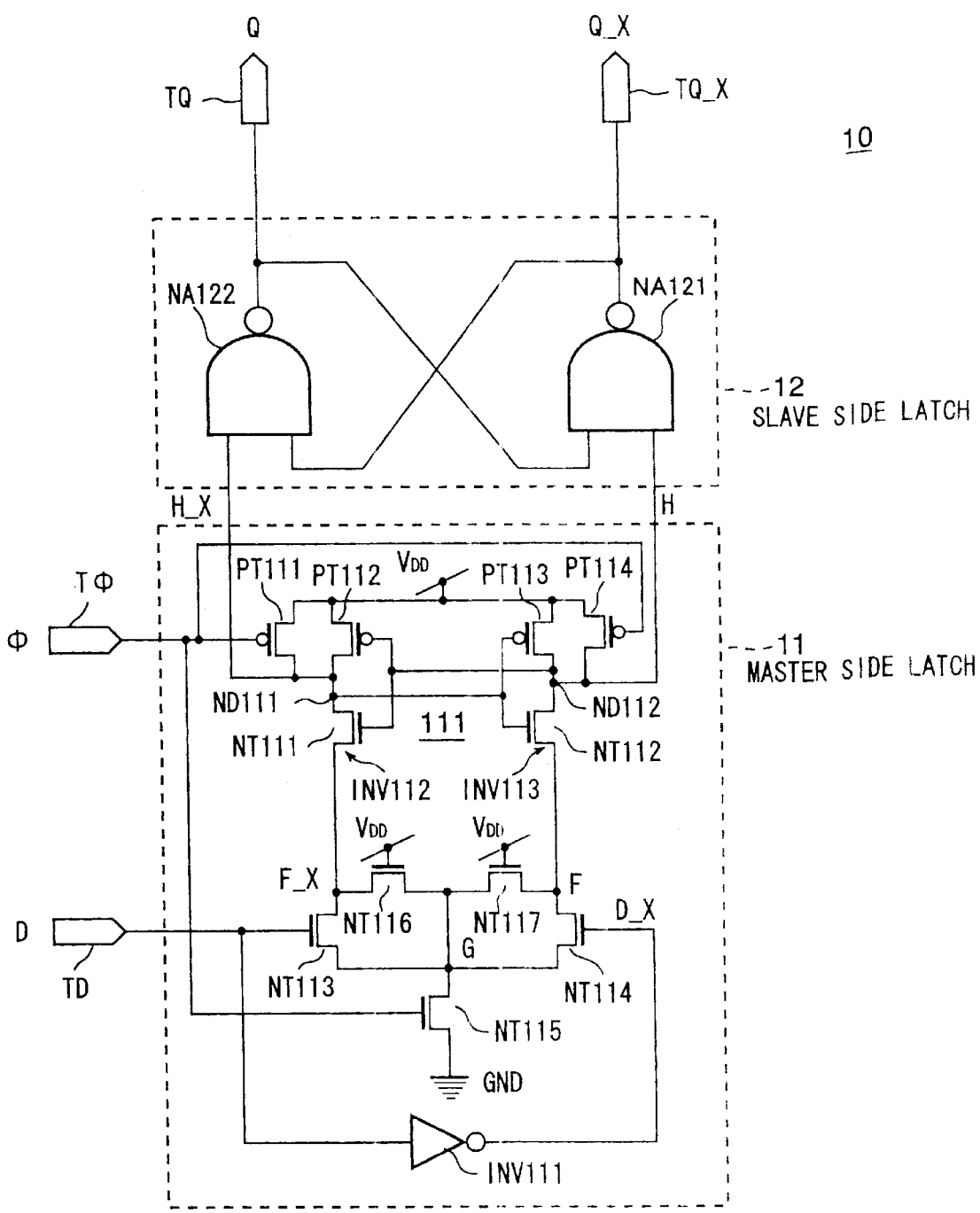
FIG. 1 is a circuit diagram showing a first embodiment of a differential sense amplifier type D-type flip-flop employing a latch according to the present invention.

FIG. 1 is a circuit diagram showing a first embodiment of a differential sense amplifier type D-type flip-flop employing the latch according to the present invention.

This differential sense amplifier type D-type flip-flop 10 is comprised by a master side latch 11 and a slave side latch 12 connected in cascade via the first output node H_X and the second output node H as shown in FIG. 1.

Note that, in the following explanation, the first potential is defined as the ground potential (0V) level and the second potential is defined as the power supply voltage $V_{DD}$ level.

The master side latch 11 has PMOS transistors PT111 to PT114, NMOS transistors NT111 to NT117, inverter INV111, inverter loop 111, synchronization signal input terminal TΦ, data input terminal TD, data output terminals TQ and T_QX, first output node H_X, second output node H, first intermediate node F_X, second intermediate node F, and third intermediate node G.

The first inverter INV112 of the inverter loop 111 is comprised by connecting drains and gates of the PMOS transistor PT112 and the NMOS transistor NT111 to each other, while the second inverter INV113 of the inverter loop 111 is comprised by connecting drains and gates of the PMOS transistor PT113 and the NMOS transistor NT112 to each other.

Also, the presetting means is comprised by the PMOS transistors PT111 and PT114, the first input discriminating means is comprised by the NMOS transistor NT113, the second input discriminating means is comprised by the NMOS transistor NT114, the power supply isolating means is comprised by the NMOS transistor NT115, the first parallel resistor means is comprised by the NMOS transistor NT116, and the second parallel resistor means is comprised by the NMOS transistor NT117.

Sources of the PMOS transistors PT111 to PT114 are connected to the supply line of the power supply voltage $V_{DD}$. Note that the source of the PMOS transistor PT112 corresponds to the second power supply terminal of the first inverter INV112, while the source of the PMOS transistor PT113 corresponds to the second power supply terminal of the second inverter INV113.

The drains of the PMOS transistors PT111 and PT112 are connected to the drain of the NMOS transistor NT111, while a connection node ND111 thereof is connected to a gate of the PMOS transistor PT113 and a gate of the NMOS transistor NT112 and the first output node H_X.

The drains of the PMOS transistors PT113 and PT114 are connected to the drain of the NMOS transistor NT112, while a connection node ND112 thereof is connected to a gate of the PMOS transistor PT112 and a gate of the NMOS transistor NT111 and the second output node H.

The gates of the PMOS transistors PT111 and PT114 are connected to the synchronization signal input terminal TΦ.

The source of the NMOS transistor NT111 (corresponding to the first power supply terminal of the first inverter INV112) is connected to the drain of the NMOS transistor NT113, while the first intermediate node F_X is comprised by the connection point thereof. The source of the NMOS transistor NT112 (corresponding to the first power supply terminal of the second inverter INV113) is connected to the drain of the NMOS transistor NT114, while the second intermediate node F is comprised by the connection point thereof.

Sources of the NMOS transistor NT113 and NMOS transistor NT114 are connected to each other, while the third intermediate node G is comprised by the connection point thereof. This third intermediate node G is connected to the drain of the NMOS transistor NT115, while the source of the NMOS transistor NT115 is connected to the ground potential (reference potential) GND.

The NMOS transistors NT116 and NT117 are connected in series between the first intermediate node F_X and the second intermediate node F.

The connection point of the source and drain of the NMOS transistor NT116 and NMOS transistor NT117 is connected to the intermediate node G.

Namely, the NMOS transistor NT116 serving as the first parallel resistor means is connected between the first intermediate node F_X and the third intermediate node G in parallel with the NMOS transistor NT113 serving as the first input discriminating means.

Similarly, the NMOS transistor NT117 serving as the second parallel resistor means is connected between the second intermediate node F and the third intermediate node G in parallel with the NMOS transistor NT114 serving as the second input discriminating means.

A gate of the NMOS transistor NT113 is connected to the data input terminal TD, a gate of the NMOS transistor NT114 is connected to an output terminal of the inverter INV111, and an input terminal of the inverter INV111 is connected to the data input terminal TD. A gate of the NMOS transistor NT115 is connected to the synchronization signal input terminal TΦ, and a gate of the NMOS transistor NT116 and a gate of the NMOS transistor NT117 are connected to the supply line of the power supply voltage $V_{DD}$.

Note that NMOS transistor NT116 and NMOS transistor NT117 having the same size are used so as to have equivalently equal resistance.

Also, the slave side latch 12 is comprised by 2-input NAND gates NA121 and NA122.

A first input terminal of the NAND gate NA121 is connected to the second output node H, and a second input terminal is connected to an output terminal of the NAND gate NA122 and the output terminal TQ of the output data Q.

A first input terminal of the NAND gate NA122 is connected to the first output node H_X, and a second input terminal is connected to an output terminal of the NAND gate NA121 and the output terminal TQ_X of the inverted output data Q_X.

Next, a detailed explanation will be made of the operation of the differential sense amplifier type D-type flip-flop 10.

This flip-flop 10 fetches the value of the data input signal D in synchronization with the rising edge of the synchronization signal Φ and outputs the same to the data output terminal TQ and the inverted data output terminal TQ_X. The value is held for one cycle of the synchronization signal Φ.

In the period where Φ=0, the PMOS transistors PT111 and PT114 become ON and the NMOS transistor NT115 becomes cut off.

Figure 2:
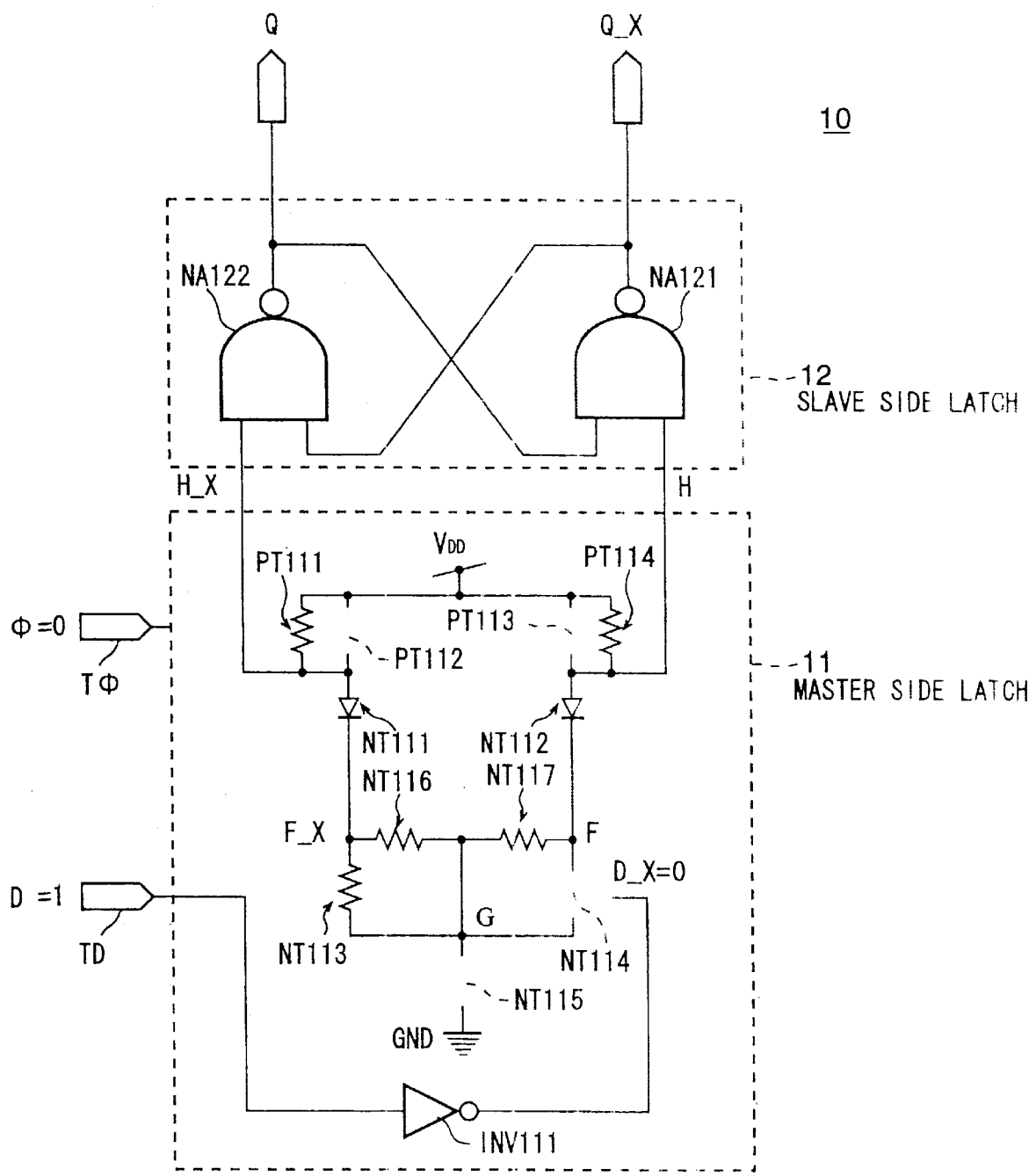
FIG. 2 is a view showing an equivalent circuit of a circuit of FIG. 1 for a period where $\Phi=0$ and where a data input signal D=1.

FIG. 2 is a view of an equivalent circuit of the circuit of FIG. 1 in this period where Φ=0 and where the data input signal D=1.

In the period where Φ=0, the PMOS transistors PT111 and PT114 equivalently behave as resistors, and the nodes H and H_X are precharged to the potential of complete logic 1 through them.

Then, the PMOS transistors PT112 and PT113 become cut off. The NMOS transistors NT111 and NT112 equivalently behave as diodes since the gate terminal and the drain terminal become the same potential.

Accordingly, when the power supply voltage is $V_{DD}$ [V] and the threshold value of the NMOS transistor is Vtn, the potentials of the nodes F and F_X at this time can be estimated to be ($V_{DD}$-Vtn) [V].

When Φ=0 both of the output nodes H and H_X of the master side latch 11 have the logic 1. This operates the NAND-RS latch of the slave side latch 12 as the hold mode.

When Φ becomes equal to 1, the PMOS transistors PT111 and PT114 become cut off, the NMOS transistor NT115 becomes ON, and the sense amplifier operates.

One of the NMOS transistor NT113 and the NMOS transistor NT114 has become cut off according to states of the data input signal D and the inverted signal DX thereof. In the example of FIG. 2, the NMOS transistor NT114 has become cut off.

At this time, a difference is produced in conductive resistances possessed by the nodes F and F_X with respect to the ground.

Figure 3:
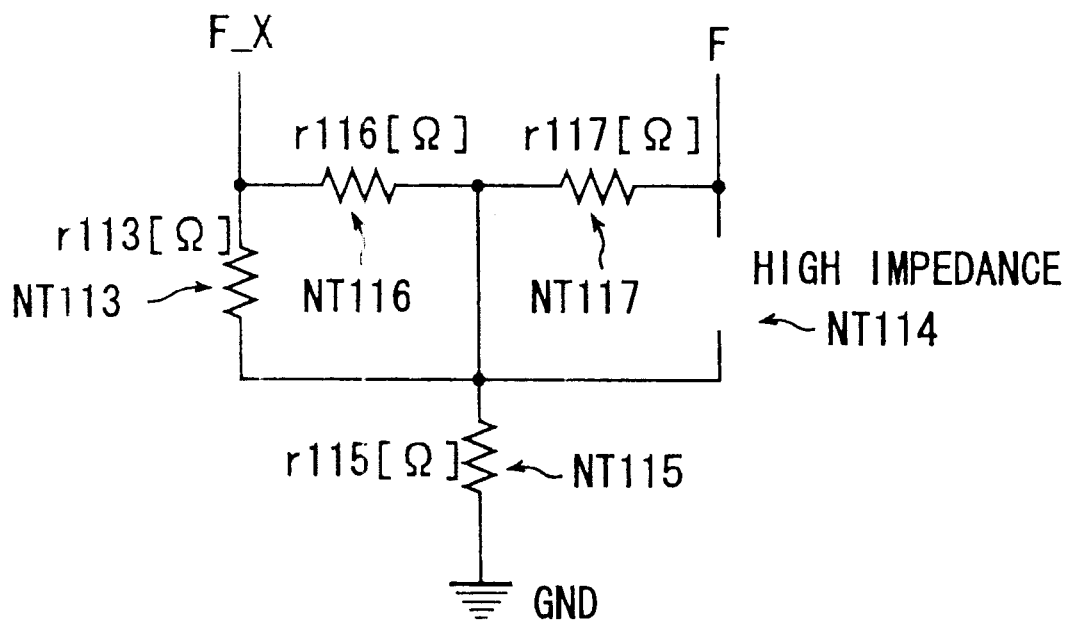
FIG. 3 is an explanatory view for conductive resistances of nodes F and F_X of FIG. 1.

A view for simply considering the conductive resistances of the nodes F and F_X is shown in FIG. 3.

When two resistors having resistance values of ra and rb [106] are connected in parallel, the combined resistance value thereof becomes (ra×rb)/(ra+rb) Ω. This combined resistance will be expressed as (ra//rb).

The following relationship equivalently stands concerning this (ra//rb) (note, ra>0 and rb>0 and are finite values. The proof is omitted).

(ra//rb)<ra, (ra//rb)<rb

Figure 18:
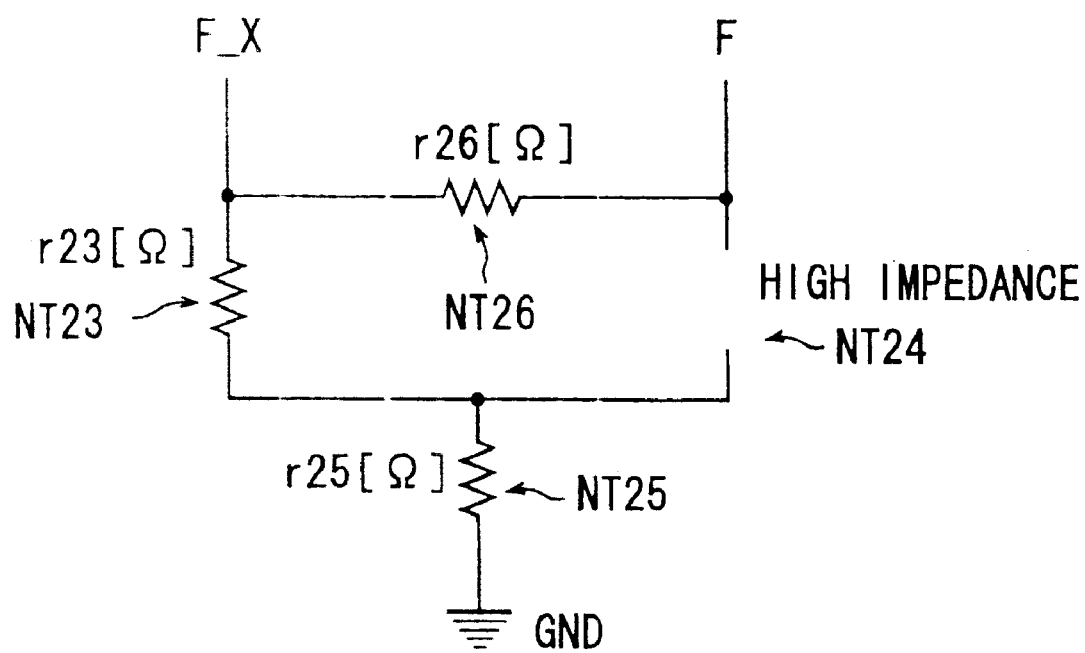
FIG. 18 is an explanatory view for conductive resistances of the nodes F and F_X of FIG. 16.

As mentioned above, the conductive resistance of the node F_X with respect to the ground in FIG. 18 (conventional case) is (r23+r25) Ω.

Contrary to this, the conductive resistance of the node F_X with respect to the ground in FIG. 3 (case of present invention) becomes ((r113//r116)+r115) Ω. Note, r23=r113 and r25=r115.

It is obvious that the following relationship equivalently stands between these two numerical figures.

(r23+r25)>((r113//r116)+r115)

It is important here that the resistance value of the discharge path is made small while keeping the resistance value of the NMOS transistor NT113 concerning the data input signal D constant, that is, keeping the size constant.

In the conventional method, when the size of the NMOS transistor NT113 (NT23 in FIG. 16) was made large in order to make the resistance r113 (r23 in FIG. 18) small, the power consumed in the NMOS transistor NT113 accompanied with the change of the data input signal D inevitably increased.

Contrary to this, in the circuit of FIG. 1 according to the present first embodiment, the conductive resistor is small in comparison with the conventional circuit, so the conductive resistance value of the discharge path can be made small and a higher speed operation can be achieved without increasing the power consumed accompanied with the change of the data input signal D.

According to FIG. 3, the conductive resistance possessed by the first intermediate node F_X with respect to the ground becomes ((r113//r116)+r115) Ω, and the conductive resistance of the second intermediate node F becomes (r117+r115) Ω.

Such a difference of conductive resistances appears n the discharge speed of charges of the nodes H and H_X. In this example, the conductive resistance possessed by the node F_X with respect to the ground is smaller, so the charges on the first output node H_X are more quickly discharged. At this time, also the charges on the second output node H are discharged.

However, due to the lowering of the potential of the first output node H_X, the PMOS transistor PT113 becomes ON and the NMOS transistor NT112 becomes cut off. The potential of the node H which starts to be fall rises, whereby a potential of complete logic 1 is obtained again.

In this way, the normal state is established in the inverter loop 111 comprised by the PMOS transistors PT112 and PT113 and the NMOS transistors NT111 and NT112.

Thereafter, even when the data input signal D and the inverted signal DX thereof change and the transistor which becomes cut off changes from the NMOS transistor NT114 to the NMOS transistor NT113, this normal state is not destroyed.

This is because, irrespective of the NMOS transistor NT113 or NT114, both of the nodes F and F_X always have paths reaching the ground via the NMOS transistors NT116 and NT117, so the inverter loop is always connected to the ground.

In this way, one of the output nodes H and H_X of the master side latch 11 becomes the logic 0 when Φ=1.

Upon receipt of this, the RS latch of the slave side R latch 12 is set or reset, and values in accordance with the input data appear at the outputs Q and QX.

Figures 4A, 4B:
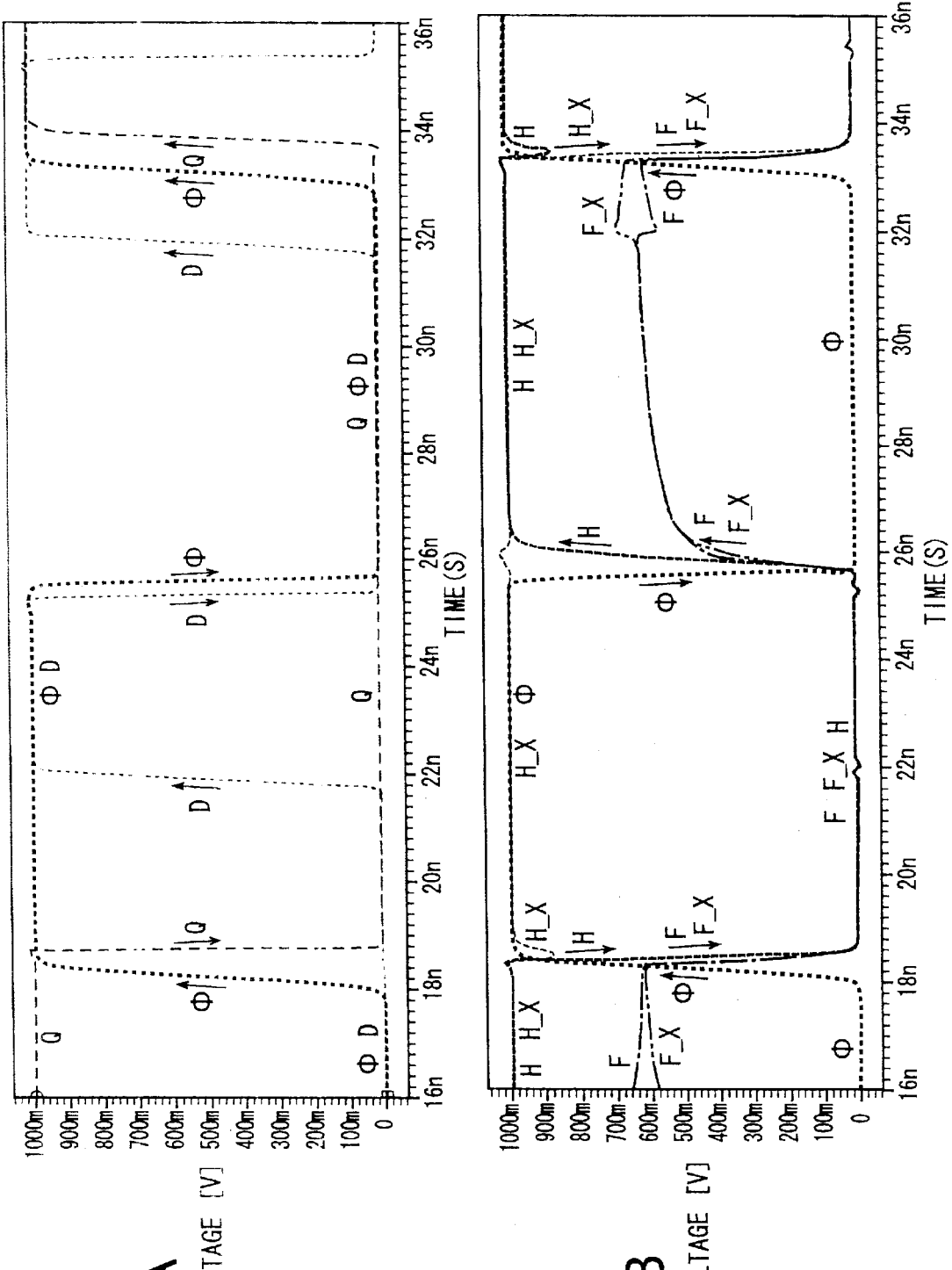
FIGS. 4A and 4B are views showing an operation waveform obtained by a circuit simulation of a flip-flop of FIG. 1.

FIGS. 4A and 4B are views showing operation waveforms obtained by circuit simulations of the flip-flop of FIG. 1.

As shown in FIGS. 4A and 4B, it is apparent that the flip-flop 10 of FIG. 1 has a small clock load and is logically correctly operating because of a high speed sampling operation by the differential sense amplifier and a small number of transistors connected to the input terminal TΦ of the synchronization signal Φ, i.e., 3.

Figure 16:
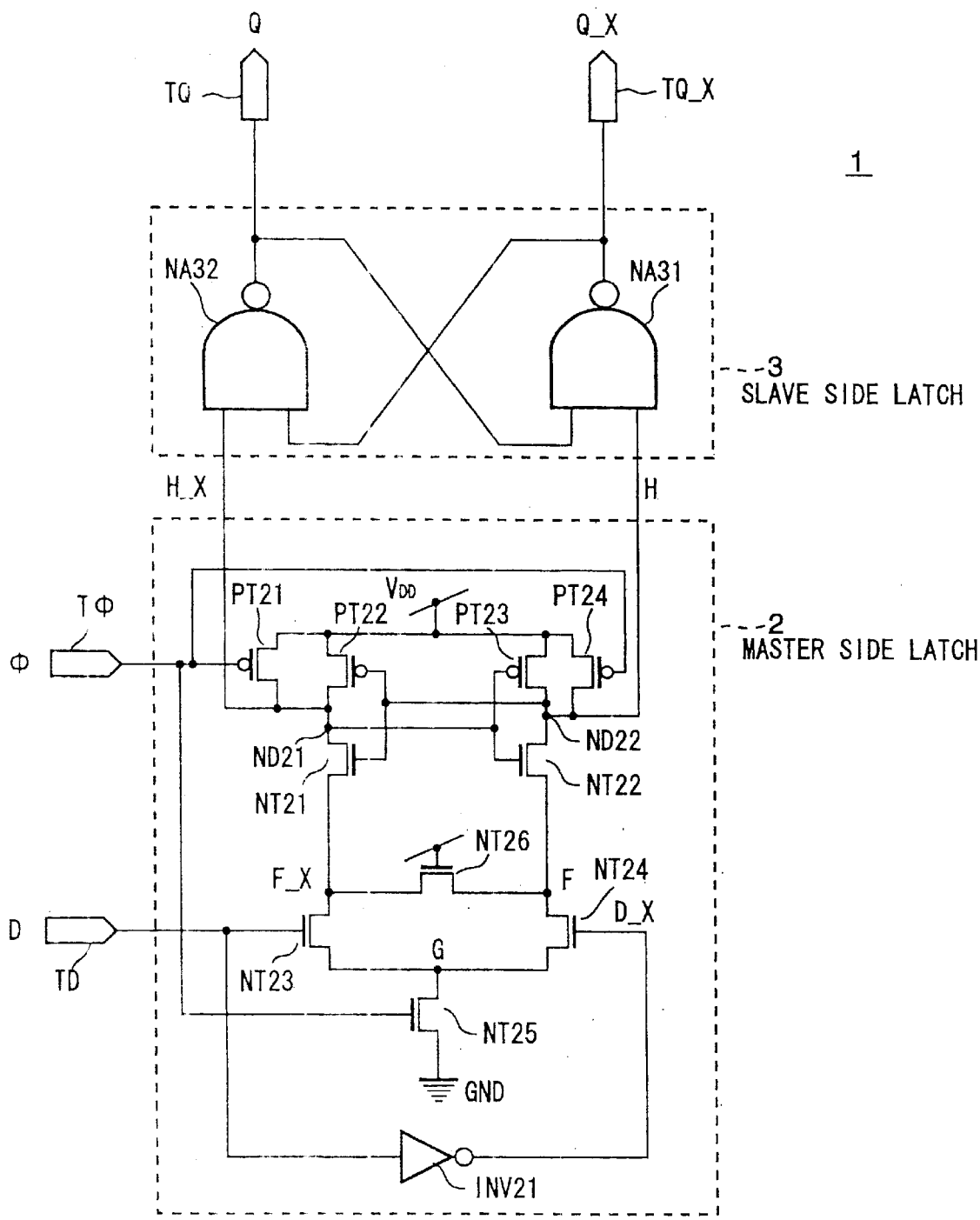
FIG. 16 is a circuit diagram showing an example of the configuration of the conventional differential sense amplifier type D-type flip-flop.
Figure 17:
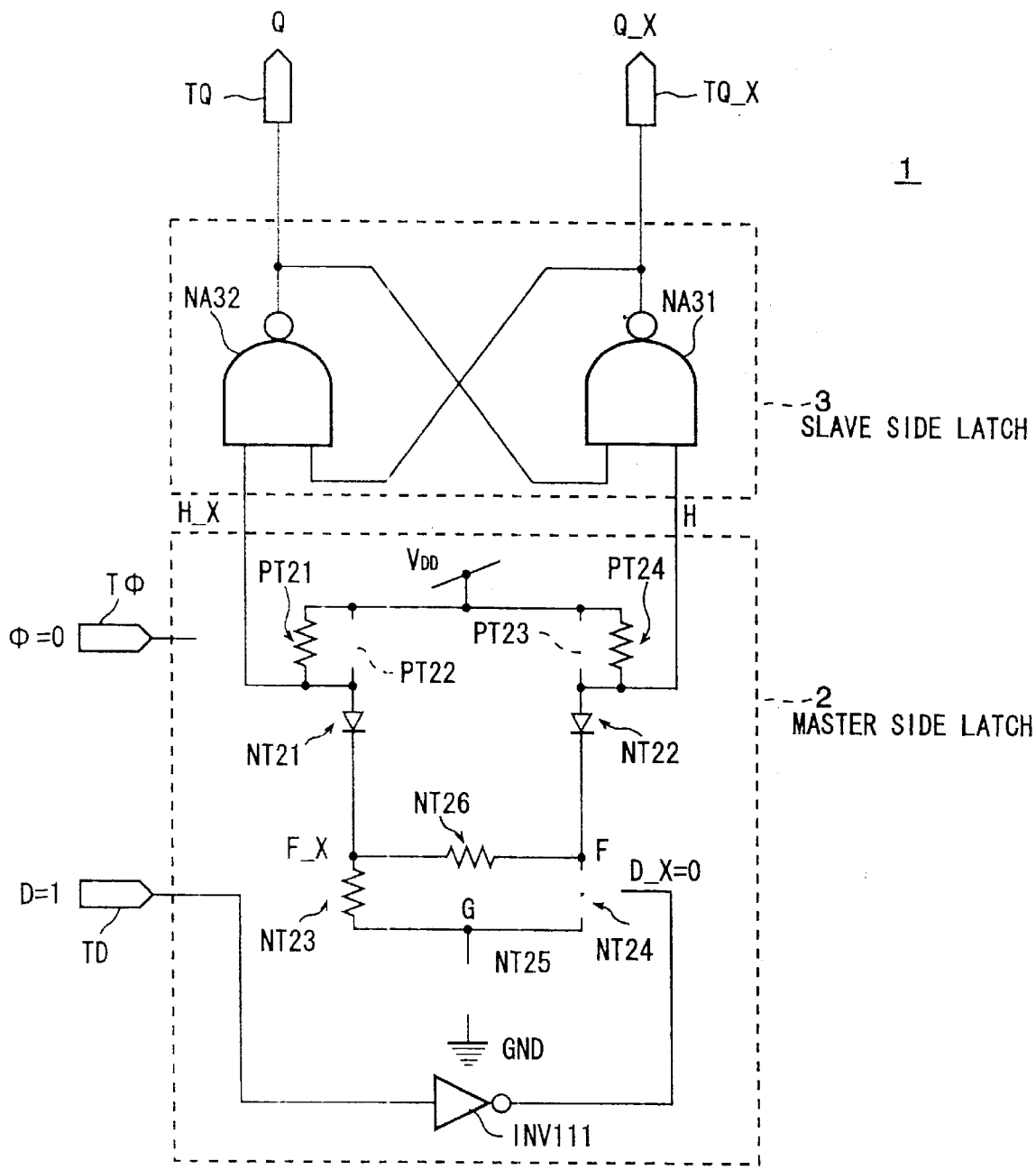
FIG. 17 is a view showing an equivalent circuit of the circuit of FIG. 16 for the period where $\Phi=0$ and where the data input signal D=1.

Also, FIG. 5 is a view showing the potential waveform of the node F_X where the data input signal D=1 is given and the synchronization signal Φ is changed from 0 to 1 in the circuit of FIG. 1 according to the first embodiment and the conventional circuit of FIG. 16.

In FIG. 5, the abscissa represents the time and the ordinate represents the voltage.

Also, in FIG. 5, a curve indicated by A shows the potential waveform of the circuit of FIG. 1 according to the first embodiment, while a curve indicated by B shows the potential waveform of the conventional circuit of FIG. 16.

It is clear from FIG. 5 that the circuit of FIG. 1 according to the first embodiment reduces the potential of the first intermediate node F_X quicker in comparison with the conventional circuit of FIG. 16.

As explained above, according to the present first embodiment, in the master side latch 11, the NMOS transistor NT116 which is always in the ON state is provided as the first parallel resistor means connected in parallel with the NMOS transistor NT113 receiving the data input signal D, and the NMOS transistor NT117 which is always in the ON state is provided as the second parallel resistor means connected in parallel with the NMOS transistor NT114 receiving the inverted data input signal DX, therefore there are advantages that the equivalent combined resistance of the discharge paths can be reduced by these resistor means, a high speed operation can be realized, and lowering of the power consumption can be realized without enlarging the transistor size of the NMOS transistors NT113 and NT114.

Second Embodiment

Figure 6:
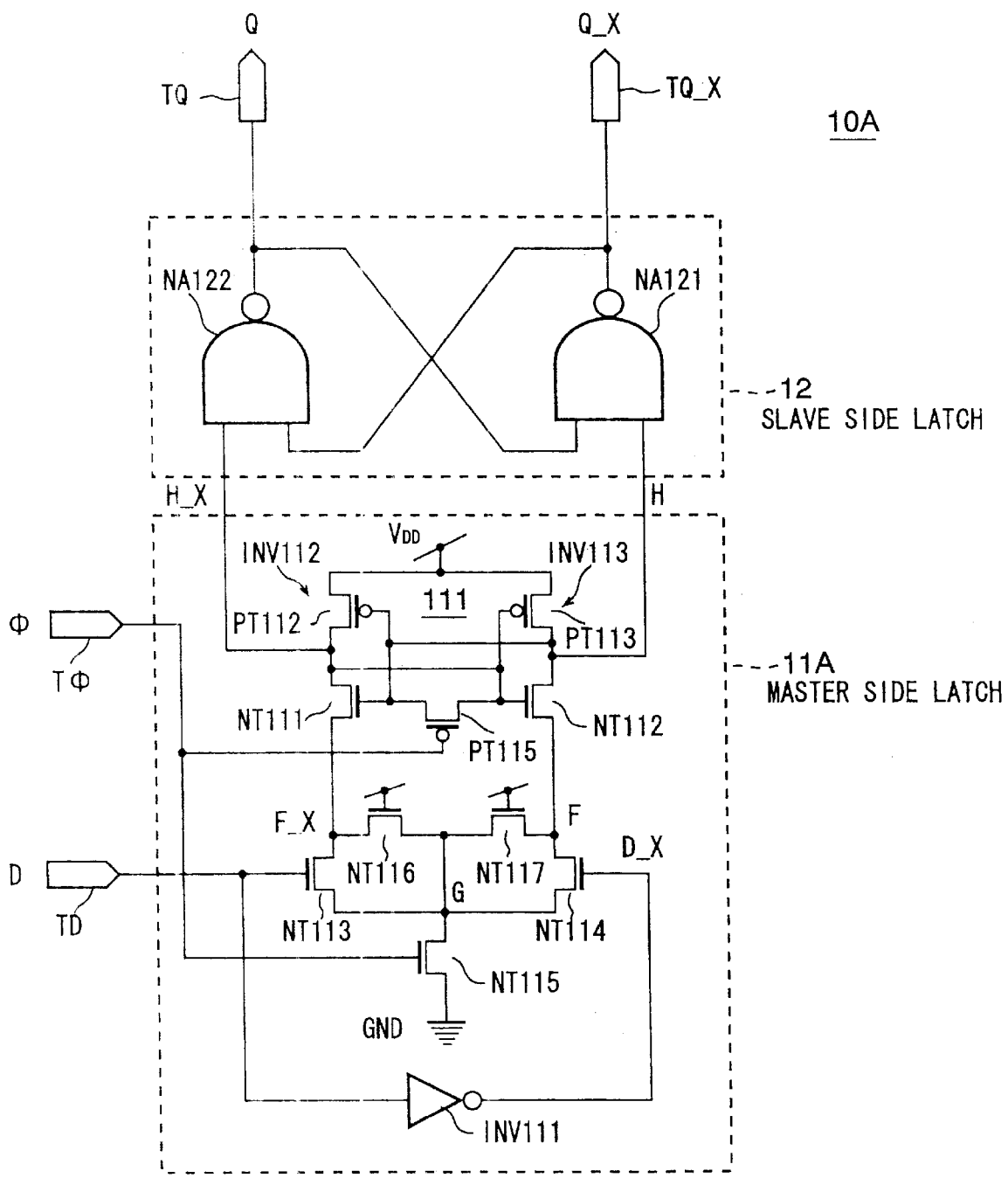
FIG. 6 is a circuit diagram showing a second embodiment of the differential sense amplifier type D-type flip-flop employing the latch according to the present invention.

FIG. 6 is a circuit diagram showing a second embodiment of the differential sense amplifier type D-type flip-flop employing the latch according to the present invention.

The difference of the present second embodiment from the first embodiment resides in that, in the master side latch, when the synchronization signal $\Phi=0$, in place of the precharge use PMOS transistors PT111 and PT114 for boosting up the output nodes H and H_X to the power supply voltage $V_{DD}$ level, the PMOS transistor PT115 serving as the balancing means is connected between the input node of the inverter INV112 and the input node of the inverter INV113 comprising the sense amplifier, in other words, between the gate of the NMOS transistor NT111 and the gate of the NMOS transistor NT112, and the gate of the PMOS transistor PT115 is connected to the synchronization signal input terminal T$\Phi$.

This PMOS transistor PT115 has the function of connecting and disconnecting the first output node H_X and the second output node H in synchronization with the synchronization signal $\Phi$.

Figure 7:
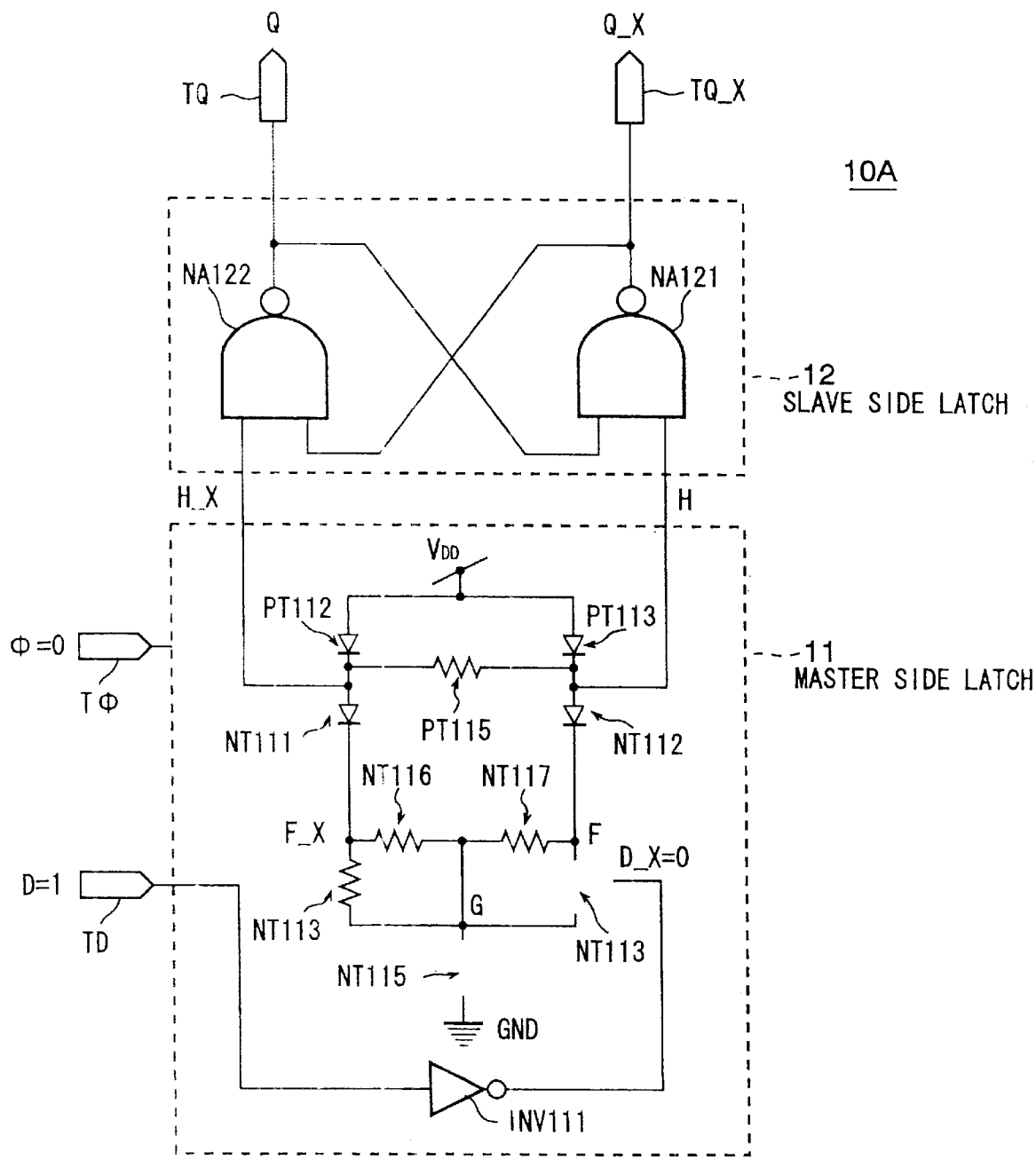
FIG. 7 is a view showing an equivalent circuit of a circuit of FIG. 6 for the period where $\Phi=0$ and where the data input signal D=1.

FIG. 7 is a view showing an equivalent circuit of the circuit of FIG. 6 for this period where $\Phi=0$ and where the data input signal D=1.

The difference of FIG. 7 from FIG. 2 of the equivalent circuit of FIG. 1 resides in that the potentials of the gate and drain terminals of the PMOS transistors PT112 and PT113 become equal by the resistor connection of the output nodes H and H_X by turning ON the PMOS transistor PT115, and the PMOS transistors PT112 and PT113 equivalently behave as diodes.

In this case, the charges are supplied to the nodes H and H_X through the PMOS transistors PT112 and PT113.

However, since there is a potential barrier of the diode, the potentials of the output nodes H and H_X do not reach the potential $V_{DD}$ of the complete logic 1.

Here, when assuming that the threshold value of PMOS is Vtp (<0), the output nodes H and H_X are recharged to the potential of $(V_{DD}-|Vtp|)$ [V].

Accompanied with this, the potentials of the intermediate nodes F and F_X are initialized to $(V_{DD}-|Vtp|-Vtn)$ [V].

The operation when $\Phi$ becomes equal to 1 is similar to that of the first embodiment.

The nodes H and H_X are initialized to the potential $(V_{DD}-|Vtp|)$ [V] of incomplete logic 1, but when the normal state is established in the inverter loop, the potential $V_{DD}$ of the complete logic 1 and the potential (0V) of the complete logic 0 are output.

The problem of the prior art discussed in Problem 2 was a large power required for initializing the potentials at the nodes at the change from $\Phi=1$ to $\Phi=0$.

In the conventional circuit shown in FIG. 16 and the circuit according to the first embodiment of FIG. 1, the output nodes H and H_X are initialized to $V_{DD}$, and the intermediate nodes F and F_X are initialized to $(V_{DD}-Vtn)$ [V].

Contrary to this, in the case of the circuit according to the present second embodiment of FIG. 6, as mentioned above, the output nodes H and H_X are initialized to $(V_{DD}-|Vtp|)$ [V], and the intermediate nodes F and F_X are initialized to $(V_{DD}-|Vtp|-Vtn)$ [V].

Namely, according to the present second embodiment, the initialization potentials of the nodes H, H_X, F and F_X can be reliably reduced by exactly |Vtp| [V].

The energy required for the charge and discharge of the potential amplitude V [V] with respect to the capacity component is proportional to a square of the potential amplitude V.

Accordingly, according to the present second embodiment, the power required for initializing the potentials at the nodes at the change from $\Phi=1$ to $\Phi=0$ can be reliably reduced.

FIGS. 8A and 8B are views showing operation waveforms obtained by circuit simulations of the flip-flop 10A of FIG. 6.

As shown in FIGS. 8A and 8B, in the flip-flop 10A of FIG. 6, as a reference, in comparison with the operation waveform (FIG. 18) of the conventional circuit of FIG. 16, the potentials of the nodes H, H_X, F and F_X when $\Phi=0$ clearly have become small. Also, it is apparent that this is logically correctly operating.

Figure 9:
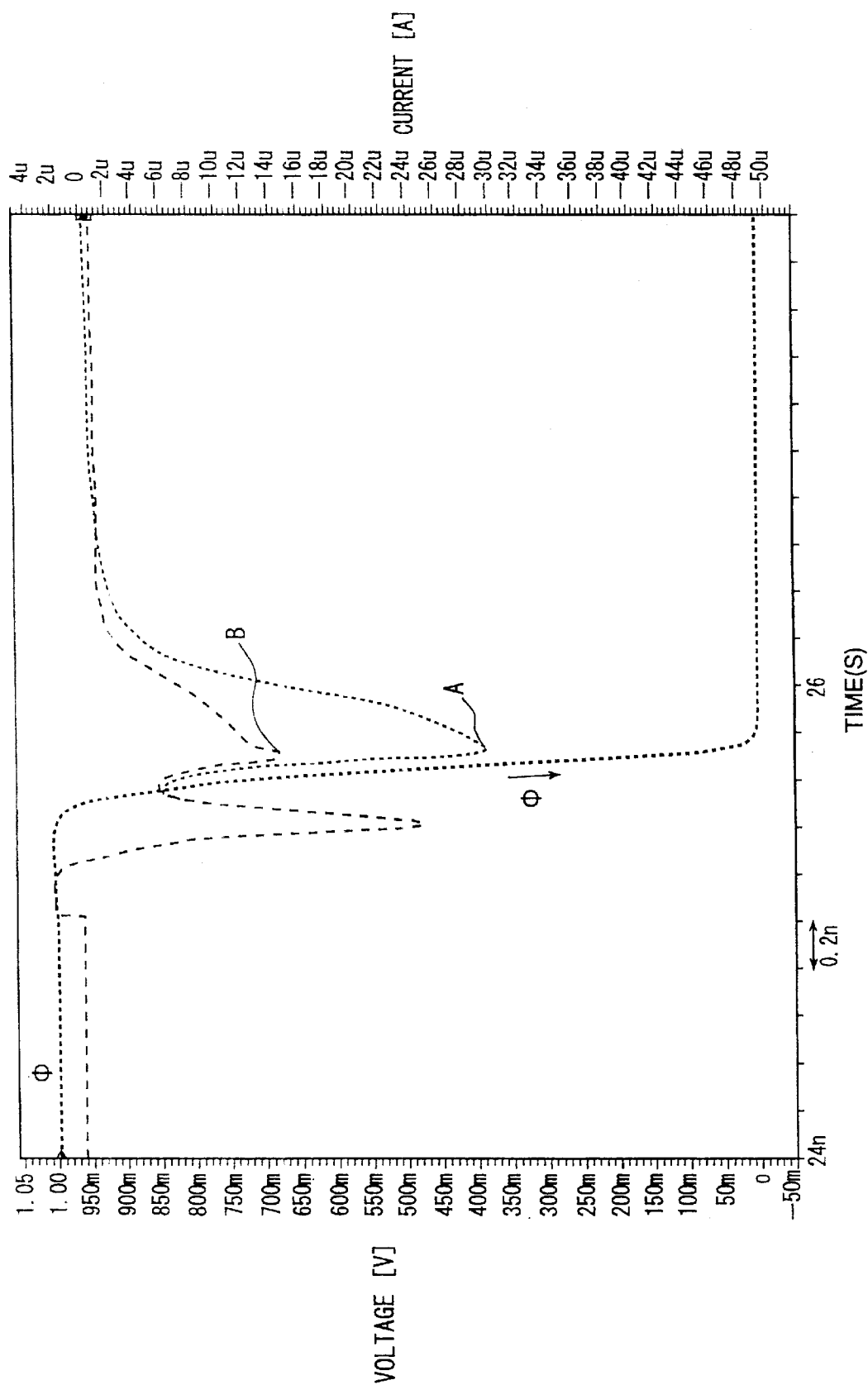
FIG. 9 is a view showing the waveform of a current flowing through a constant voltage source in a case where the data input signal D is constant and does not change, but the synchronization signal $\Phi$ is changed from 1 to 0 in the circuit of FIG. 1 according to the first embodiment and the circuit of FIG. 6 according to the present second embodiment.

Also, FIG. 9 is a view showing the waveform of the current flowing through the constant voltage power supply in the case where the data input signal D is constant and not changed and the synchronization signal $\Phi$ is changed from 1 to 0 in the circuit of FIG. 1 according to the first embodiment and the circuit of FIG. 6 according to the present second embodiment.

In FIG. 9, the abscissa represents the time, and the ordinate represents the voltage and current.

Also, in FIG. 9, the curve indicated by A shows the potential waveform of the circuit of FIG. 1 according to the first embodiment, and the curve indicated by B shows the current waveform of the circuit of FIG. 6 according to the second embodiment.

In other words, FIG. 9 shows the current value consumed in the circuit. Note, the direction of the current has become negative, therefore this view means that the larger current flows toward the bottom.

As clear from FIG. 9, in the circuit according to the second embodiment, the amount of the consumed current has become small in comparison with the circuit of FIG. 1 according to the first embodiment.

As explained above, according to the present second embodiment, in place of the precharge use PMOS transistors PT111 and PT114 used in the first embodiment, the PMOS transistor PT115 serving as the balancing means for connecting/isolating the nodes H and H_X by the synchronization signal $\Phi$ is provided. Therefore, in addition to the effect of the first embodiment mentioned above, the initialization potentials of the internal nodes can be reduced, so there is an advantage that the power consumption can be reduced.

Third Embodiment

Figure 10:
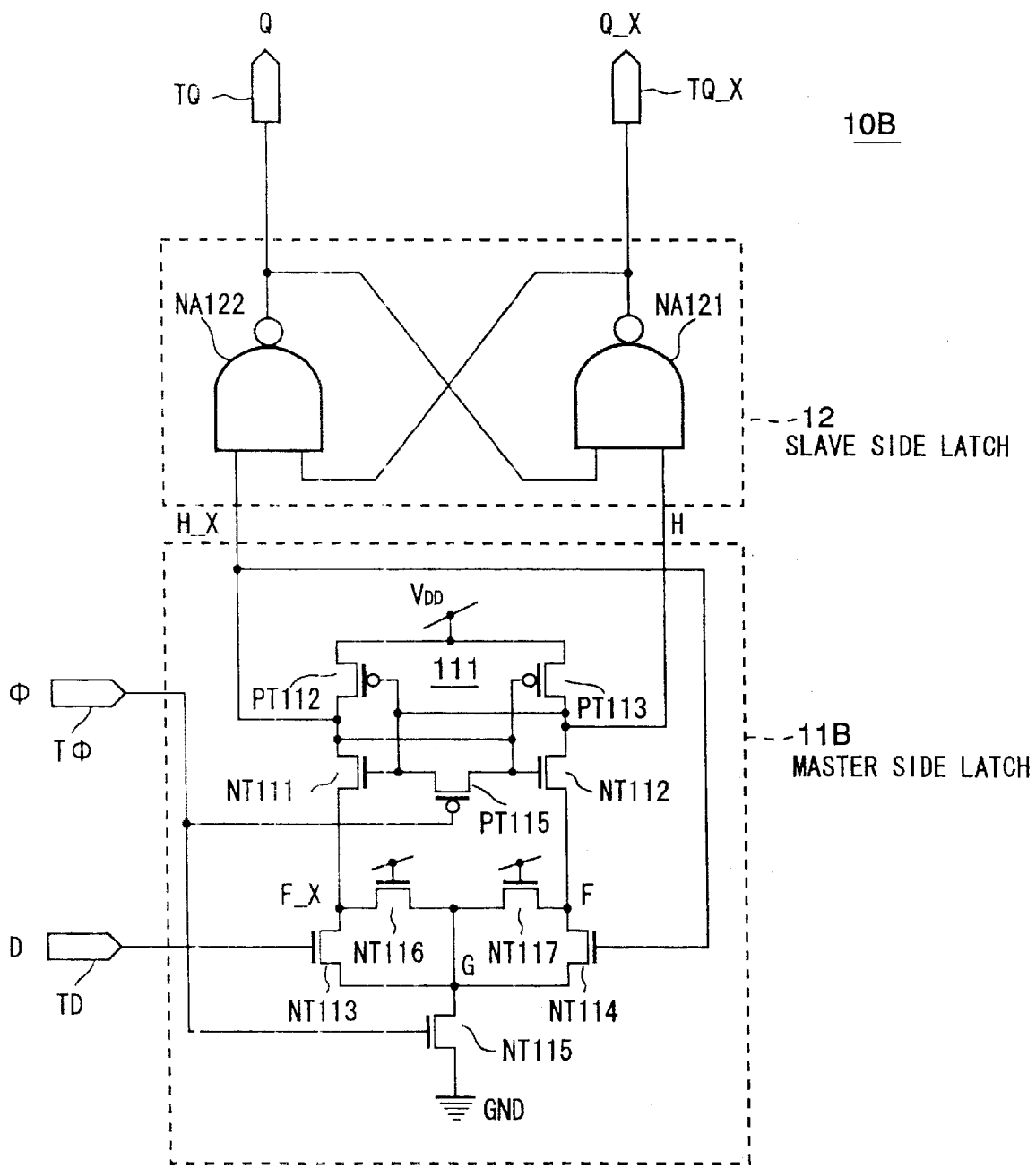
FIG. 10 is a circuit diagram showing a third embodiment of the differential sense amplifier type D-type flip-flop employing the latch according to the present invention.

FIG. 10 is a circuit diagram showing a third embodiment of a differential sense amplifier type D-type flip-flop employing a latch according to the present invention.

The difference of the present third embodiment from the second embodiment resides in that, in the master side latch, the gate of the NMOS transistor NT114 is connected to the first output node H_X in place of the connection to the data input terminal TD via the inverter.

Note that, in the present third embodiment, the first discriminating means is comprised by the NMOS transistor NT113, and the second discriminating means is comprised by the NMOS transistor NT114.

Figure 11:
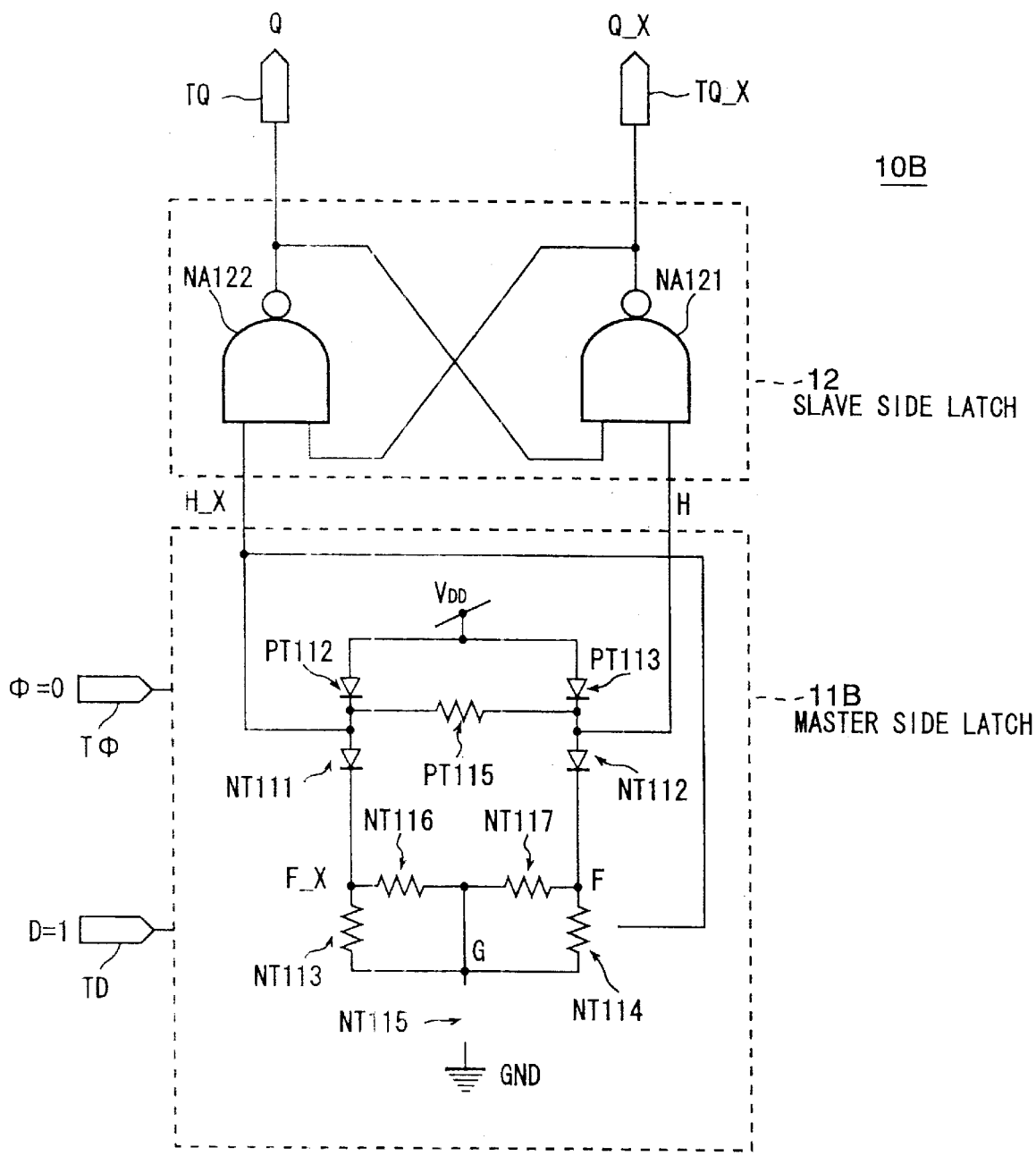
FIG. 11 is a view showing an equivalent circuit of a circuit of FIG. 10 for the period where $\Phi=0$ and where the data input signal D=1.

FIG. 11 is a view showing an equivalent circuit of the circuit of FIG. 10 for this period where $\Phi=0$ and where the data input signal D=1.

As shown in FIG. 11, the difference of the equivalent circuit of FIG. 10 according to the present third embodiment from FIG. 7 serving as the equivalent circuit of FIG. 6 resides in that, since the potential of the gate terminal of the NMOS transistor NT114 becomes equal to that of the first output node H_X, when Φ=0 and at an instant when Φ becomes equal to 1, the NMOS transistor NT114 is not cut off irrespective of whether the data input signal D has the logic 0 or 1.

In FIG. 7 of the equivalent circuit of FIG. 6, when D=1, the potential 0 V of logic 0 is added to the gate terminal of the NMOS transistor NT114 by the inverter INV111, so the NMOS transistor NT114 is cut off.

The step of initialization of the output nodes H and H_X and intermediate nodes F and F_X when Φ=0 is similar to that of the second embodiment, the output nodes H and H_X are initialized to the potential of $(V_{DD}-|Vtp|)$ [V], and the intermediate nodes F and F_X are initialized to the potential of $(V_{DD}-|Vtp|-Vtn)$ [V].

Namely, the circuit according to the present third embodiment continuously holds a low power consumption property possessed by the circuit according to the second embodiment.

The functional difference of the circuit of FIG. 10 according to the present third embodiment from the circuit of FIG. 6 according to the second embodiment resides in the steps of the discharge and the establishment of the normal state occurring when Φ becomes equal to 1.

Here, assume that the transistor size of the NMOS transistor NT113 is equal to or larger than the transistor size of the NMOS transistor NT114. Also, assume that the transistor sizes of the NMOS transistor NT116 and the NMOS transistor NT117 are equal.

Figure 12:
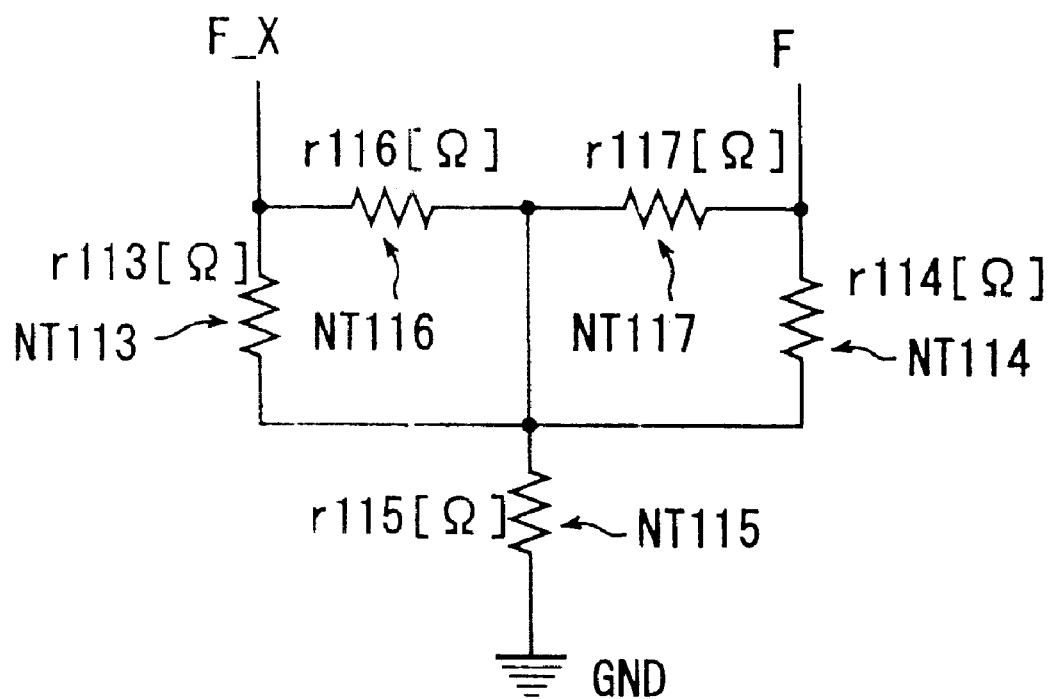
FIG. 12 is an explanatory view for conductive resistances of the nodes F and F_X of FIG. 10.

A view for simply considering the conductive resistances of the nodes F and F_X is shown in FIG. 12.

Where D=1, the potential $V_{DD}$ of the complete logic 1 is added to the gate terminal of the NMOS transistor NT113, and it is in the complete ON state.

On the other hand, the potential of the first output node H_X is added to the gate terminal of the NMOS transistor NT114.

At the instant when Φ becomes equal to 1, this potential is $(V_{DD}-|Vtp|)$ [V]. For this reason, the NMOS transistor NT114 is in the not complete, but weak ON state.

The conductive resistance of the MOS transistor depends upon the potential of the gate terminal. In the case of a NMOS transistor, the higher the potential of the gate terminal, the smaller the conductive resistance thereof.

Namely, in the example shown in FIG. 12, clearly r113<r114.

Accordingly, the conductive resistance possessed by the first intermediate node F_X becomes ((r113//r116)+r115) Ω.

On the other hand, the conductive resistance possessed by the second intermediate node F is ((r114//r117)+r115) Ω.

r113<r114, and r116=r117 from the above assumption, so the following relationship clearly stands.

$$((r113//r116)+r115)<((r114//r117)+r115)$$

That is, although both of the NMOS transistor NT113 and NMOS transistor NT114 are in the ON state, the equivalent resistance value possessed by the NMOS transistor NT114 is larger, so there arises a difference between the conductive resistances possessed by the intermediate nodes F and F_X. Where D=1, the conductive resistance of the second intermediate node F_X is smaller.

On the other hand, where D=0, the potential 0 [V] of the complete logic 0 is added to the gate terminal of the NMOS transistor NT113, so it is in the complete cut off state.

Contrary to this, the NMOS transistor NT114 is in the weak ON state similar to the previous time.

At this time, the conductive resistance possessed by the first intermediate node F_X becomes (r116+r115) Ω. On the other hand, the conductive resistance possessed by the node F is ((r114//r117)+r115) Ω.

Then, since r116=r117, the following relationship clearly stands.

$$(r116+r115)>((r114//r117)+r115)$$

That is, where D=0, the conductive resistance of the second intermediate node F is smaller.

By this, in both cases of D=1 and D=0, there is a difference between the conductive resistances of the intermediate nodes F and F_X, so the difference can be caused in the discharge speed of charges on the output nodes H and H_X.

In this way, the inverter loop 111 can be established in the normal state of correct logic in accordance with the data input signal D.

Note that, the problem of the prior art discussed in Problem 3 was the increase of the power consumption accompanied with a fluctuation of the data signal by the use of the inverter for generating the inverted signal since the inverted signal of the data input signal is required in the operation principle thereof.

According to the present third embodiment, the inverted signal of the data input signal is not required in principle and the power consumed at the inverter can be reduced.

Further, in the present third embodiment, even if the data input signal D fluctuates, the potential of the gate terminal of the NMOS transistor NT114 does not fluctuate.

Contrary to this, in the prior art, the potential of the gate terminal of the NMOS transistor NT114 (NT24 in FIG. 16) fluctuated, and the power was consumed each time.

Namely, according to the present third embodiment, in comparison with the related art, the power generated accompanied with the fluctuation of the data signal in the inverter and the NMOS transistor NT114 can be reduced.

FIGS. 13A and 13B are views showing the operation waveforms obtained by circuit simulations of the flip-flop 10B of FIG. 10.

As shown in FIGS. 13A and 13B, in the flip-flop 10B of FIG. 10, for reference, in comparison with the operation waveform (FIG. 18) of the conventional circuit of FIG. 16, the potentials of the nodes H, H_X, F and F_X when Φ=0 clearly have become small. Also, it is apparent that this is logically correctly operating.

Also, FIG. 14 is a view showing the waveform of the current flowing through the constant voltage source in the case where the data input signal D is changed from 0 to 1 and changed to 0 again, but the synchronization signal Φ is constant and not changed in the circuit of FIG. 6 according to the second embodiment and the circuit of FIG. 10 according to the present third embodiment.

In FIG. 14, the abscissa represents the time, and the ordinate represents the voltage and the current.

Also, in FIG. 14, the curve indicated by A shows the current waveform of the circuit of FIG. 6 according to the second embodiment, and the curve indicated by B shows the current waveform of the circuit of FIG. 10 according to the third embodiment.

In other words, FIG. 14 shows the current value consumed in the circuit. Note, the direction of the current has become negative, so this view means that the larger current is flowing toward the bottom.

As apparent from FIG. 14, in the circuit according to the third embodiment, the consumed amount of current has become smaller in comparison with the circuit of FIG. 6 according to the second embodiment.

Also, as mentioned above, the characteristic feature of the present third embodiment resides in that, according to whether the potential of the data input signal D is large or small in comparison with the initialization potential ($V_{DD}$−|Vtp|) [V] of the first output node H_X, the logic state thereof is decided.

Accordingly, the potential of the data input signal D does not have to be the complete logic potential ($V_{DD}$ or 0V).

That is, the data can also be fetched for a signal having a smaller amplitude than the complete logic amplitude.

Figure 15:
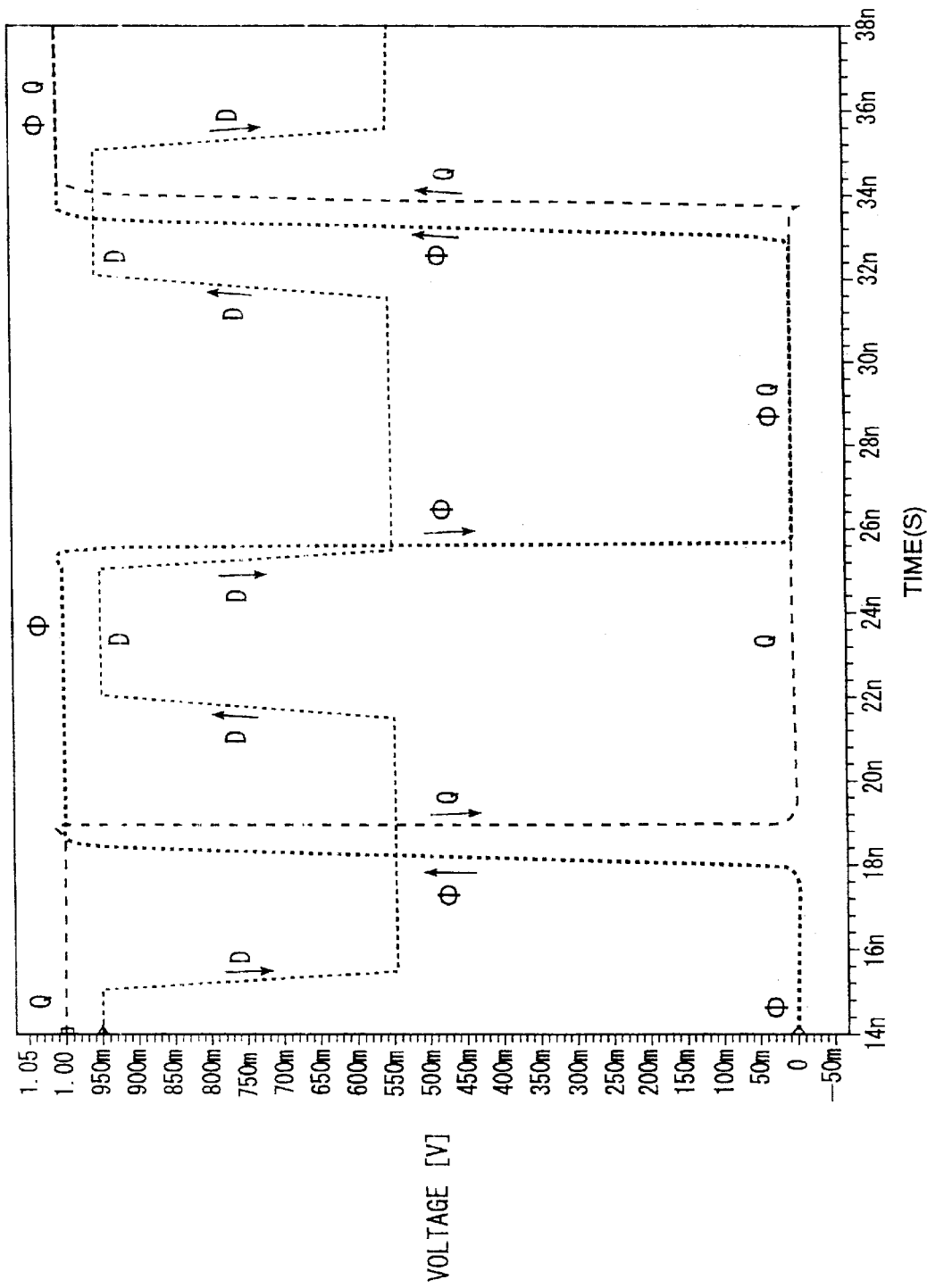
FIG. 15 is a view showing the operation waveform when performing circuit simulation for a small signal amplitude data input for proving that data can also be fetched for a signal having a smaller amplitude than a complete logic amplitude in the circuit of FIG. 10.

FIG. 15 is a view showing the operation waveform when performing circuit simulation for small signal amplitude data input for proving that data can be also fetched for a signal having a smaller amplitude than the complete logic amplitude in the circuit of FIG. 10.

In FIG. 15, the abscissa represents the time, and the ordinate represents the voltage.

As apparent from FIG. 15, in the circuit of FIG. 10, the data input is correctly fetched, and it can be output as the complete logic potential.

A bus capable of transmitting the data with a small signal amplitude can be realized by using a circuit according to the present third embodiment on the receiver side of the data transmission line.

As mentioned above, the power consumption of the CMOS VLSI is proportional to the square of the potential amplitude V.

The potential amplitude of the data is changed from 1.0 [V] to 0.4 [V] in FIG. 15, so the power consumption of the bus through which the data is transmitted is reduced to 0.16 time.

Summarizing the effects of the invention, as explained above, according to the present invention, a higher speed operation can be achieved.

Also, according to the present invention, there is the advantage that the power consumption can be reduced.

Note that the present invention is not limited to the above embodiments and includes modifications within the scope of the claims.

What is claimed is:

1. A latch comprising:
   a first output node;
   a second output node;
   a first intermediate node;
   a second intermediate node;
   a third intermediate node;
   an inverter loop having a first inverter provided with first and second power supply terminals and having the first power supply terminal connected to the first intermediate node and a second inverter provided with first and second power supply terminals and having the first power supply terminal connected to the second intermediate node, an output terminal of the first inverter and an input terminal of the second inverter being connected to the first output node, and an output terminal of the second inverter and an input terminal of the first inverter being connected to the second output node;
   a first input discriminating means containing a resistor component, electrically isolating the first intermediate node and the third intermediate node when data input signal is at a first potential level, and connecting them when it is at a second potential level;
   a second input discriminating means containing a resistor component, electrically isolating the second intermediate node and the third intermediate node when an inverted signal of the data input signal is at the first potential level, and connecting them when it is at the second potential level;
   a first parallel resistor means connected between the first intermediate node and the third intermediate node in parallel with the first input discriminating means;
   a second parallel resistor means connected between the second intermediate node and the third intermediate node in parallel with the second input discriminating means;
   a power supply isolating means for electrically isolating the third intermediate node and a reference potential when a synchronization signal is at the first potential level, and connecting them when it is at the second potential level; and
   a presetting means for setting the first output node and the second output node at predetermined potentials when the synchronization signal is at the first potential level.

2. A latch as set forth in claim 1, wherein the presetting means includes a balancing means for electrically connecting the first output node and the second output node when the synchronization signal is at the first potential level and isolating them when it at the second potential level.

3. A latch comprising:
   a first output node;
   a second output node;
   a first intermediate node;
   a second intermediate node;
   a third intermediate node;
   an inverter loop having a first inverter provided with first and second power supply terminals and having the first power supply terminal connected to the first intermediate node and a second inverter provided with first and second power supply terminals and having the first power supply terminal connected to the second intermediate node, an output terminal of the first inverter and an input terminal of the second inverter being connected to the first output node, and an output terminal of the second inverter and an input terminal of the first inverter being connected to the second output node;
   a first discriminating means containing a resistor component, electrically isolating the first intermediate node and the third intermediate node when data input signal is at the first potential level, and connecting them when it is at the second potential level;
   a second discriminating means containing a resistor component, electrically isolating the second intermediate node and the third intermediate node when the potential of the first output node is at the first potential level, and connecting them when it is at the second potential level;
   a first parallel resistor means connected between the first intermediate node and the third intermediate node in parallel with the first discriminating means;
   a second parallel resistor means connected between the second intermediate node and the third intermediate node in parallel with the second discriminating means;
   a power supply isolating means for electrically isolating the third intermediate node and the reference potential when the synchronization signal is at the first potential level and connecting them when it is at the second potential level; and a presetting means for setting the first output node and the second output node at predetermined potentials when the synchronization signal is at the first potential level.

4. A latch as set forth in claim 3, wherein the presetting means includes a balancing means for electrically connecting the first output node and the second output node when the synchronization signal is at the first potential level and isolating them when it at the second potential level.

5. A D-type flip-flop comprising:

a master side latch including:
   a first output node;
   a second output node;
   a first intermediate node;
   a second intermediate node;
   a third intermediate node;
   an inverter loop having a first inverter provided with first and second power supply terminals and having the first power supply terminal connected to the first intermediate node and a second inverter provided with first and second power supply terminals and having the first power supply terminal connected to the second intermediate node, an output terminal of the first inverter and an input terminal of the second inverter being connected to the first output node, and an output terminal of the second inverter and an input terminal of the first inverter being connected to the second output node;
   a first input discriminating means containing a resistor component, electrically isolating the first intermediate node and the third intermediate node when data input signal is at a first potential level, and connecting them when it is at a second potential level;
   a second input discriminating means containing a resistor component, electrically isolating the second intermediate node and the third intermediate node when an inverted signal of the data input signal is at the first potential level, and connecting them when it is at the second potential level;
   a first parallel resistor means connected between the first intermediate node and the third intermediate node in parallel with the first input discriminating means;
   a second parallel resistor means connected between the second intermediate node and the third intermediate node in parallel with the second input discriminating means;
   a power supply isolating means for electrically isolating the third intermediate node and a reference potential when a synchronization signal is at the first potential level, and connecting them when it is at the second potential level; and
   a presetting means for setting the first output node and the second output node at predetermined potentials when the synchronization signal is at the first potential level and a slave side latch having a set terminal and a reset terminal connected to either of the first output node or the second output node of the master side latch and holding the logic output of the master side latch for one cycle of the synchronization signal.

6. A D-type flip-flop as set forth in claim 5, wherein presetting means includes a balancing means for electrically connecting the first output node and the second output node when the synchronization signal is at the first potential level and isolating them when it is the second potential level.

7. A D-type flip-flop comprising:

a master side latch including:
   a first output node;
   a second output node;
   a first intermediate node;
   a second intermediate node;
   a third intermediate node;
   an inverter loop having a first inverter provided with first and second power supply terminals and having the first power supply terminal connected to the first intermediate node and a second inverter provided with first and second power supply terminals and having the first power supply terminal connected to the second intermediate node, an output terminal of the first inverter and an input terminal of the second inverter being connected to the first output node, and an output terminal of the second inverter and an input terminal of the first inverter being connected to the second output node;
   a first discriminating means containing a resistor component, electrically isolating the first intermediate node and the third intermediate node when data input signal is at the first potential level, and connecting them when it is at the second potential level;
   a second discriminating means containing a resistor component, electrically isolating the second intermediate node and the third intermediate node when the potential of the first output node is at the first potential level, and connecting them when it is at the second potential level;
   a first parallel resistor means connected between the first intermediate node and the third intermediate node in parallel with the first discriminating means;
   a second parallel resistor means connected between the second intermediate node and the third intermediate node in parallel with the second discriminating means;
   a power supply isolating means for electrically isolating the third intermediate node and the reference potential when the synchronization signal is at the first potential level, and connecting them when it is at the second potential level; and
   a presetting means for setting the first output node and the second output node at predetermined potentials when the synchronization signal is at the first potential level and a slave side latch having a set terminal and the reset terminal connected to either of the first output node or the second output node of the master side latch and holding the logic output of the master side latch for one cycle of the synchronization signal.

8. A D-type flip-flop as set forth in claim 7, wherein the presetting means includes a balancing means for electrically connecting the first output node and the second output node when the synchronization signal is at the first potential level and isolating them when it is at the second potential level.

* * * * *